United States Patent
Inoue et al.

(10) Patent No.: US 8,227,893 B2
(45) Date of Patent: Jul. 24, 2012

(54) SEMICONDUCTOR DEVICE WITH CAPACITOR ELEMENT

(75) Inventors: Naoya Inoue, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 348 days.

(21) Appl. No.: 11/571,084

(22) PCT Filed: Jun. 23, 2005

(86) PCT No.: PCT/JP2005/111561
§ 371 (c)(1),
(2), (4) Date: Jun. 28, 2007

(87) PCT Pub. No.: WO2006/001349
PCT Pub. Date: Jan. 5, 2006

(65) Prior Publication Data
US 2007/0291441 A1    Dec. 20, 2007

(30) Foreign Application Priority Data
Jun. 23, 2004    (JP) .................................. 2004-184757

(51) Int. Cl.
*H01L 27/08* (2006.01)
(52) U.S. Cl. .......... 257/532; 257/E27.048; 257/E21.021
(58) Field of Classification Search .................. 257/306, 257/309, 532, 534, E27.016, E27.048, E29.343, 257/E21.008, E21.011, E21.015, E21.016, 257/E21.017, E21.021
See application file for complete search history.

(56) References Cited

U.S. PATENT DOCUMENTS

| 5,923,062 | A | * | 7/1999 | Ohno | 257/298 |
| 2001/0020713 | A1 | * | 9/2001 | Yoshitomi et al. | 257/306 |
| 2002/0179955 | A1 | * | 12/2002 | Morimoto et al. | 257/306 |
| 2004/0113235 | A1 | * | 6/2004 | Coolbaugh et al. | 257/532 |

FOREIGN PATENT DOCUMENTS

| JP | 7-111107 | 4/1995 |
| JP | 7-3431 | 7/1995 |
| JP | 7-211862 | 8/1995 |
| JP | 9-67193 | 3/1997 |
| JP | 9-129730 | 5/1997 |
| JP | 10-173140 | 6/1998 |

(Continued)

OTHER PUBLICATIONS

International Search Report dated Oct. 11, 2005.

(Continued)

*Primary Examiner* — Wensing Kuo
(74) *Attorney, Agent, or Firm* — Whitham, Curtis, Christofferson & Cook, P.C.

(57) ABSTRACT

In a capacitor element in which a highly dielectric metal oxide film formed between wiring layers is used as a capacitor insulation film, the diffusion and thermal oxidation of a lower-layer wiring material are reduced, and the surface on which a thin capacitor insulation film that constitutes a capacitor element is formed is kept flat. A lower electrode (111*b*) having the ability to prevent diffusion of the wiring material is embedded and formed so as to be in direct contact with a lower-layer wiring (105) in a prescribed area of a wiring cap film (103), and the surface on which the capacitor insulation film is formed is flat. The wiring cap film functions to prevent diffusion and oxidation of the wiring material formed on a wiring disposed in a lower layer of the capacitor element.

8 Claims, 20 Drawing Sheets

FOREIGN PATENT DOCUMENTS

| | | |
|---|---|---|
| JP | 2001-237375 | 8/2001 |
| JP | 2001-313371 | 11/2001 |
| JP | 2002-118173 | 4/2002 |
| JP | 2003-51501 | 2/2003 |
| JP | 2003 264235 | 9/2003 |
| JP | 2003264236 | 9/2003 |
| JP | 2003-309174 | 10/2003 |
| JP | 2004-6850 | 1/2004 |
| JP | 2004-14761 | 1/2004 |
| JP | 2004-063731 | 2/2004 |
| JP | 2005-198766 | 7/2005 |
| JP | 2005-236235 | 9/2005 |

OTHER PUBLICATIONS

Japanese Office Action dated Aug. 16, 2011 with English translation

* cited by examiner

SEMICONDUCTOR DEVICE WITH CAPACITOR ELEMENT

TECHNICAL FIELD

The present invention relates to a semiconductor device wherein a capacitor element is incorporated into large scale integrated circuit (LSI), and in particular relates to a semiconductor device wherein a capacitor element having a metallic layer/high dielectric insulating film/metallic layer structure is incorporated into an LSI having a multilayer wiring structure.

BACKGROUND ART

The design dimensions of ultra-high integration circuits (ULSI) formed on a Si semiconductor substrate are being made ever smaller due to the need for reducing costs, improving performance, and minimizing power consumption. Functionality is improved by reducing the dimensions and increasing the number of integrated elements, and costs are lowered by reducing the chip size. Improving the degree of integration further allows a plurality of circuit blocks having different functions to be combined, and reducing the number of components enables the cost of devices in which ULSI chips are incorporated to be lowered. So combining circuit blocks having varied functions in this manner not only results in lower costs, but allows communication speeds to be improved and other benefits to be realized. Further performance-related enhancements can also be achieved by incorporating circuit blocks having diverse functionality. Reducing the design dimensions also allows the operating voltage to be lowered, which enables the power consumed by the circuit bocks sharing the same function to be minimized.

However, new problems have been encountered as the size of the active elements becomes progressively smaller. Such problems are described below in relation to categories such as power supply noise, RF/analog circuits, and memory.

Problems associated with power supply noise shall be described first. The voltage decreases as the size of the elements is reduced, but the number of integrated elements increases sharply; therefore, the amount of current consumed increases sharply as well. Furthermore, as the elements become smaller, the operating frequency increases and the switching time decreases. Specifically, the amount of current used during switching increases, and the switching time decreases; therefore, the change in current over time (di/dt) sharply increases. L·di/dt, which is obtained by multiplying the circuit inductance L by the change in current over time, is the inductive voltage variation, and is known as "simultaneous switching noise." Simultaneous switching noise causes the power supply potential to fluctuate, and occasionally reverses the logic state. Not only does the power supply voltage decrease as the dimensions are made smaller, as described above, but noise-derived fluctuations in voltage increase. The noise margin accordingly decreases at an accelerated pace. The inductive noise can be reduced by lowering the impedance of the circuit, and variation in the power supply can be suppressed by introducing a capacitor to the circuit. Such a capacitance is referred to as a decoupling capacitance. In conventional ULSIs, a MOS capacitance obtained when the transistors are formed is used as the decoupling capacitance. However, MOS capacitance insulating films become thinner as design dimensions continue to decrease, and a problem arises in regard to the sharp increase of leakage current in the insulating films. The noise margin also drops precipitously; therefore, the absolute capacitance becomes inadequate, and a tendency is shown whereby the surface area of the chip is increased by a decoupling capacitance, which is introduced in order to stabilize the power supply potential. In order to circumvent such problems, it is necessary to provide the wiring layer with a decoupling capacitance which is higher than the MOS capacitance and in which an insulating film having a dielectric constant is used. Incorporating capacitance in the wiring layer enables the capacitance to be placed on top of the transistor as seen in a plan view, and the mounting surface area can therefore be made greater than that of the MOS capacitance. Increasing the dielectric constant enables greater capacitance to be obtained in the same area, and thereby allows a large capacitance to be established within a limited area. By way of example, the films shown in patent documents 1 through 4 may be used as high-dielectric insulating films.

Improvements in operating speed due to the miniaturization of MOS active elements make it easier to design radio-frequency (RF) signal processing circuits as MOS devices. If RF devices can be built using MOS devices, then combining them with a digital baseband circuit will result in functional enhancements, cost reductions, and other benefits. Similar advantages can be obtained by combining analog circuits with digital circuits. Resistor elements, capacitor elements, inductors, and other passive elements can be efficiently used in RF or analog devices. Accordingly, it is of profound importance to integrate passive elements along with the active elements used in MOS logic circuits. MOS logic circuits become increasingly miniaturized with each generation, but the characteristics of passive elements are determined solely on their physical properties, for which reason such elements do not undergo further miniaturization with each generation. Accordingly, the relative surface area of passive elements increases in ULSI chips, and is a factor in preventing the chip cost from decreasing. With capacitor elements, the fact that a parasitic capacitance is formed between the electrodes and the silicon substrate is also a problem associated with operating characteristics. As ULSIs are made smaller, their structure shrinks in three dimensions, causing the distance between the wiring layer and the substrate to decrease. At the same time, the capacitor element electrode area increases in relation to the surrounding circuit, and the parasitic capacitance formed with the substrate is thereby increased. The increase in the relative size of the area also makes the parasitic resistance of the electrodes harder to disregard. In order to resolve the aforedescribed problems, high-dielectric capacitor elements are preferably positioned further apart from the substrate. More specifically, the capacitor elements need to be provided to the uppermost wiring layer.

The miniaturization of the manufacturing process also exacerbates problems with memory device. SRAM is used as CMOS memory. SRAM holds the memory state by latching logic signals in a CMOS circuit in a complementary fashion. In recent years, with the progress in miniaturization, the gate capacitance has decreased, and problems have been encountered in that the logic is inverted by charges produced by alpha rays or cosmic rays. Such errors are referred to as soft errors. Soft errors in a SRAM signify damage to the memory state, which is a serious problem. In order to solve such problems, there have been attempts to add capacitor elements to memory nodes for the purpose of obtaining an equivalent increase in gate capacitance.

Many problems are solved in this manner by adding capacitor elements in the wiring layer. However, new problems are created by the addition of capacitor elements in the wiring layer. One of them concerns the heat resistance of the insulation film in a state-of-the-art wiring structure wherein the wiring material primarily composed copper is formed in the interlayer insulation film having a low dielectric constant. This imposes an upper limit on the processing temperatures, which range from 350 to 400° C. Accordingly, the temperature at which capacitor elements are formed must be set to 350° C. as the upper limit. Since copper is easily diffused in an insulation film, a barrier film for reducing the diffusion of copper must be disposed between the interlayer insulation film, the capacitor insulation film, and the cooper wiring. In view of the above, careful consideration must be given to the structure and manufacturing process of the capacitor elements to be formed in the copper wiring.

Described below are disclosed examples of capacitor element structures and manufacturing methods devised for the purpose of forming a capacitance in a wiring layer.

(Prior Art 1)

Patent Document 5 discloses a structure in which a capacitor element is added to a cell in order to improve resistance to soft errors in an SRAM. The structure in this document is one in which a capacitor element having a stacked structure is formed from upper and lower electrodes that cover the upper portion of the memory cell, and from a capacitor insulation film disposed between the electrodes. Also, in the document, polysilicon is used as the electrode material, and silicon nitride film is used as the capacitor insulation film.

(Prior Art 2)

Patent Document 6 discloses a structure in which a material other than nitrogen carbide or silicon carbide can be used for the capacitor dielectric film. The technique in this document relates to a capacitor structure formed on a multilayered wiring structure having copper wiring. With a structure having conventional copper wiring, a nitrogen carbide film or silicon carbide film is necessarily formed as an antioxidation insulation layer on the copper wiring. For this reason, these films must be used as capacitor insulation films in order to form a capacitor on the copper wiring. The technique used in this document is used for avoiding such restrictions. With the technique described in the document, a metal film rather than an insulation film is used as the antioxidation film. A barrier metal is disposed between the exposed surface of the copper wiring and the metal film. This metal film is formed so as to remain on the copper wiring, and the capacitor insulation film is formed on the metal film. In this case, only the interlayer insulation film is exposed in the portion that excludes the metal film exposed as the lower electrode on the copper wiring, and the lower electrode has greater oxidation resistance than the copper wiring. The metal oxide dielectric film can thereby be used as the capacitor insulation film.

(Prior Art 3)

Patent Document 7 discloses a method whereby a capacitor element obtained using a $Ta_2O_5$ dielectric film is formed on copper wiring. In this case, a Ta film is disposed between the Cu film and the $Ta_2O_5$ film in order to prevent Cu diffusion. The Ta film is slightly oxidized when the $Ta_2O_5$ film is formed, but there is also an effect whereby oxidation of the underlying copper wiring is reduced.

(Prior Art 4)

Patent Document 8 discloses a structure for a semiconductor device in which the copper wiring structure is connected to the lower surface of the lower electrode, and an electric charge is supplied to the lower electrode via the copper wiring. This structure makes it possible to prevent the diffusion of copper into the interlayer insulation film and other oxide films, and to allow the wiring to function in a reliable manner. This semiconductor device has an MIM capacitance provided with a lower electrode connected to the upper surface of one or a plurality of wires, and an upper electrode that is connected via capacitive coupling to the lower electrode. The lower electrode is composed of a material that prevents the diffusion of the wiring material. A wiring structure is also enclosed. In this structure, an insulation film, which is ordinarily formed after the copper wiring has been formed and which prevents copper from oxidizing and diffusing, is opened only in the capacitance formation portions, and the lower electrode and the copper wiring of the lower layers are connected via these openings.

[Patent Document 1] Japanese Laid-Open Patent Application No. 7-3431
[Patent Document 2] Japanese Laid-Open Patent Application No. 7-111107
[Patent Document 3] Japanese Laid-Open Patent Application No. 9-67193
[Patent Document 4] Japanese Laid-Open Patent Application No. 10-173140
[Patent Document 5] Japanese Laid-Open Patent Application No. 2004-6850
[Patent Document 6] Japanese Laid-Open Patent Application No. 2004-14761
[Patent Document 7] Japanese Laid-Open Patent Application No. 2003-264236
[Patent Document 8] Japanese Laid-Open Patent Application No. 2003-264235

DISCLOSURE OF THE INVENTION

Problems that the Invention is to Solve

However, the conventional examples of the above-described Patent Documents 5 to 8 have the following problems. In the conventional example described in Patent Document 5, polysilicon is used as the electrode material, and the electrode therefore oxidizes when a metal oxide dielectric film having a high dielectric constant is used. For this reason, a silicon nitride film must be used as the capacitor insulation film. With a silicon nitride film, it is difficult to secure sufficient capacitance in the continuously decreasing cell size of SRAM.

With the conventional example described in Patent Document 6, the lower electrode and barrier metal are also inserted between the upper and lower wiring in the portions in which capacitance is not formed. The barrier metal and lower electrode material having strong oxidation resistance generally have higher electrical resistance, and show higher resistance between the upper and lower wiring. Also, the capacitor insulation film and the upper electrode are formed after the lower electrode and barrier metal have been processed, but the insulation film is nonuniform between the electrodes in the portions in which the pitch of the lower electrodes is narrow, resulting in defective characteristics. Forming films by CVD in order to improve coverage over the lower electrode is therefore preferred, but heat that is at least 400° C. or higher must be applied in order to thermally decompose the starting material when using the CVD method. Thus, a high-temperature process is not suitable for copper wiring with a low dielectric constant.

In the conventional example described in Patent Document 7, there is no description of an insulation film that would prevent oxidation and diffusion of copper and that is usually required in copper wiring, and there is no indication of compatibility with the integration process of copper wiring.

In the conventional example described in Patent Document 8, sufficient consideration is given to integration with copper wiring. However, a stepped portion is present when the HIM capacitive layer film is formed and etched. Growth tends to be abnormal or inadequate in the corner and side wall areas of the stepped portion. In MIM capacitance in particular, there is a serious problem in that the thickness of the capacitor insulation film must be reduced in order to increase the capacitance density. The CVD method, which has excellent surface covering characteristics, can be used to achieve uniform growth in the side wall areas and other locations. As already mentioned above, however, the growth temperature of CVD is high, and it is difficult to form a film on copper wiring. In addition, it is difficult to control the etching of a stepped portion formed from several layers, and etching defects are easily generated.

An object of the present invention is to provide a semiconductor device wherein a large capacitor element is mounted, and more specifically to provide a semiconductor device wherein a capacitor element having a metallic layer/high dielectric insulating film/metallic layer structure is incorporated into an LSI having a multilayer wiring structure and to provide a semiconductor device mounted with a capacitor element which has sufficient capacitance and stable characteristics, in which the thermal oxidation and diffusion of the lower-layer wiring material are reduced.

Means for Solving the Problems

In the semiconductor device according to a first aspect of the present invention, a capacitor element in which an upper electrode, a capacitor insulation film, and a lower electrode are layered in order from the top is mounted on wiring, the semiconductor device characterized in that the lower electrode is embedded in a groove opened to a lower-layer wiring in an insulation film formed on the underlying lower-layer wiring, and the lower electrode and the lower-layer wiring are in direct contact.

In this case, the upper electrode and the capacitor insulation film are preferably formed over a region that extends beyond the edge of the lower electrode, in a planar view.

In the semiconductor device according to a second aspect the present invention, a capacitor element in which an upper electrode, a capacitor insulation film, a second lower electrode, and a first lower electrode are layered in order from the top is mounted on wiring, the semiconductor device characterized in that the first lower electrode is embedded in a groove opened to a lower-layer wiring in an insulation film formed on the underlying lower-layer wiring; the lower electrode and the lower-layer wiring are in direct contact; and the second lower electrode, the capacitor insulation film, and the upper-electrode film are formed over a region that extends beyond the edge of the lower electrode, in a planar view.

According to the present invention, the semiconductor device is further characterized in comprising, on the upper electrode, an insulation film that has the same thickness and material as the insulation film formed on the lower-layer wiring.

According to the present invention, the semiconductor device is further characterized in that a via-plug of the wiring and a contact plug of an upper electrode of the capacitor element are formed simultaneously, and the via-plug and the contact plug of the upper electrode are connected to a wiring formed in the upper-layer portion of the capacitor element.

According to the present invention, the semiconductor device is further characterized in that copper is the principal component of all the elements selected from the lower-layer wiring directly connected to the lower electrode of the capacitor element, an upper-layer wiring formed on the upper layer of the capacitance element, the via-plug for connecting the lower-layer wiring and the upper-layer wiring, and the contact plug for connecting the upper electrode and the upper-layer wiring.

According to the present invention, the semiconductor device is further characterized in that the insulation film, which is formed on the lower-layer wiring and in which the lower electrode is embedded, is formed from a material that reduces copper diffusion, particularly, SiN or SiCN.

According to the present invention, the semiconductor device is further characterized in that the lower electrode embedded in the insulation layer is composed of a material that reduces copper diffusion, particularly a TaN film.

According to the present invention, the semiconductor device comprises a multilayer wiring composed of three or more layers, the semiconductor device characterized in having a single capacitor element layer between any two of the wiring layers, wherein at least two or more capacitor element layers are layered, and the capacitor elements of each layer are connected in parallel by way of a wiring layer.

According to the present invention, the semiconductor device is further characterized in that the same aperture is used to completely form a via-plug and a contact plug that form part of a wiring in which the upper electrodes of capacitor elements formed in multiple layers are connected in parallel.

According to the present invention, the semiconductor device is further characterized in that a capacitor element is mounted between the uppermost-wiring layer and a pad.

Effects of the Invention

In accordance with the present invention, the lower electrode having barrier characteristics against Cu and the surface of the wiring cap film similarly having barrier characteristics against Cu are kept flat in a continuous manner, whereby a capacitor insulation film composed of a metallic oxide that provides a high dielectric constant in a low temperature process such as that typified by the sputtering method can be formed without concern for the coating characteristics. For this reason, a capacitor element can be mounted without compromising the reliability of multilayer wiring that comprises a copper/low dielectric insulation film.

DESCRIPTION OF THE REFERENCE NUMERALS

Figure 1:
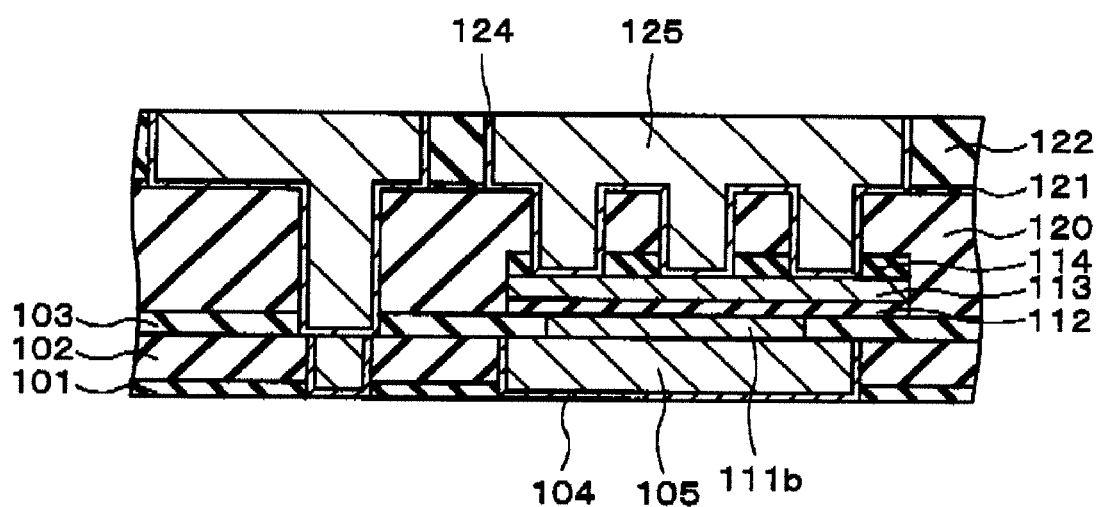
FIG. 1 is a diagram showing the structure of a capacitor element incorporated in wiring according to the present invention.

101 Via cap insulation film or etching stop film
102 Interlayer insulation film of the wiring layers
103 wiring cap insulation film
104 Barrier metal
105 Wiring
110 Hard mask
111A Lower electrode film
111B Embedded lower electrode (first lower electrode)
111C Second lower electrode
111D Electroconductive barrier film comprising a portion of the embedded lower electrode
111E metallic film comprising a portion of the embedded lower electrode
112 Capacitor insulation film
113 Upper electrode
114 Capacitor cap insulation film
115 Upper-electrode contact
116 Aperture for forming an embedded lower electrode
120 Interlayer insulation film of the via layers
121 Etching stopper film
122 Interlayer insulation film of the wiring layers
124 Barrier metal
125 Wiring and via-plug (dual damascene)
127 Via-plug
128 Wiring
130 Via cap insulation film
201 Device separation
202 Gate
203 Diffusion layer
204 Interlayer insulation film
205 Contact plug
205g Contact connected to ground potential
205s Contact connected to supply potential
205b Contact connected to bit lines
205n Cell node contact shared by the gates and diffusion layer
311 Memory cell
312 Selective transistor
401 First wiring layer
402 First via layer
403 Second wiring layer
404 Second via layer
405 Third wiring layer
406 Third via layer
407 Fourth wiring layer
411 Capacitor element of the first layer
412 Capacitor element of the second layer
413 Capacitor element of the third layer
501 Passivation
502 Pad metal

BEST MODE FOR CARRYING OUT THE INVENTION

The semiconductor device according to embodiments of the present invention is described in detail below. FIG. 1 is a diagram showing an example of the structure of a capacitor element incorporated into wiring in the semiconductor device of the present embodiment.

In the semiconductor device of the present embodiment, a capacitor element in which an upper electrode, a capacitor insulation film, and a lower electrode are layered in order from the top is mounted on wiring, and is characterized in that the lower electrode is embedded in a groove opened to a lower-layer wiring in the insulation film formed on the underlying lower-layer wiring, and the lower electrode and the lower-layer wiring are in direct contact.

Figure 19:
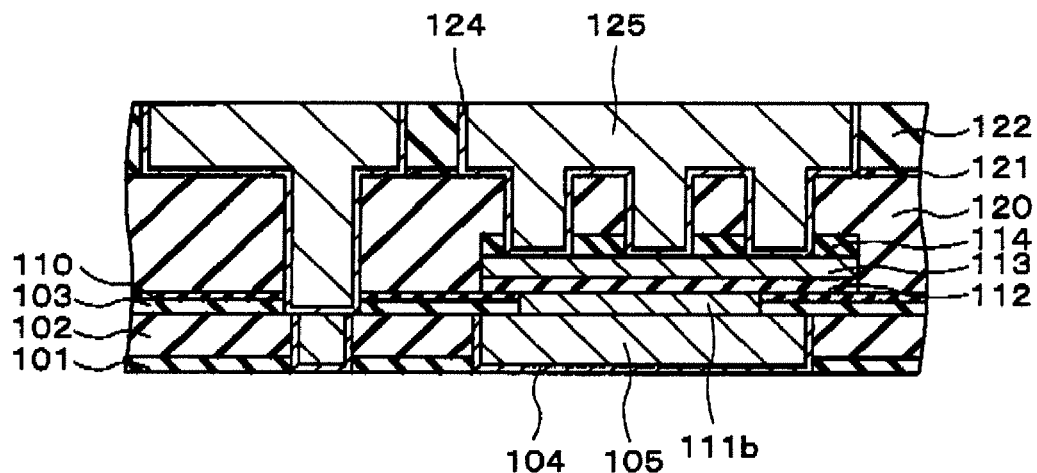
FIG. 19 is a cross-sectional diagram showing the structure of the capacitor element incorporated into the wiring of the present invention.

In the embodiment shown in FIG. 1, a groove is formed in an interlayer insulation film 102 and a lower-layer via-cap film 101, and an embedded wiring (lower-layer wiring) 105 composed of a barrier metal 104 and groove-filling copper are formed in the groove. A lower electrode 111b is embedded and formed so as to be in direct contact with the lower-layer wiring 105 in the groove opened to the embedded wiring 105 in a prescribed area of the wiring cap film 103 that is formed on the wiring and is used to prevent diffusion and oxidation of the wiring material. The lower electrode 111b is formed from a material such as TaN. The material has the ability to prevent diffusion of the wiring material due to direct contact between the lower electrode 111b and the lower-layer wiring 105. For this reason, the surface on which a capacitor insulation film 112 is formed is made flat in the capacitor element comprising the capacitor insulation film 112 and an upper electrode 113. The upper electrode 113 and capacitor insulation film 112 are shaped, in terms of arrangement. so as to enclose the lower electrode 111b, as shown in FIG. 1. Specifically, the upper electrode 113 and capacitor insulation film 112 are formed to the edge of the lower electrode 111b, or an area that is beyond the edge, in a planar view. In the diagram, 114 is a capacitor cap film formed on the upper portion of the capacitor element, 120 is a via-interlayer insulation film, 121 is an etching stopper film, 122 is a wiring interlayer insulation film, 124 is a barrier metal, and 125 is embedded wiring and a via-plug (upper-layer wiring). FIG. 19 explicitly shows a hard mask 110 for processing a wiring cap that remains between the wiring cap film 103 and the via-interlayer insulation film 120 in the present embodiment. The hard mask 110 and via-interlayer insulation film 120 are made of the same material, whereby the hard mask substantially conforms to the via-interlayer film and forms the structure shown in FIG. 1.

The TaN film used as the lower electrode 111b has a property that prevents the copper wiring material from diffusing and has resistance to oxidation. The TaN film is generally used as a barrier metal for copper wiring, has very good compatibility with the copper wiring process, does not have connection problems between the copper wiring and interlayer insulation films, and is devoid of other drawbacks.

A metallic oxide film that provides a high dielectric constant is formed at 350° C. or less as an insulation film, whereby a capacitor element can be mounted without compromising the reliability of a multilayer wiring composed of a copper/low dielectric insulation film.

The lower electrode is embedded in the antioxidation/anti-diffusion insulation film formed on the copper wiring, whereby the copper wiring of the lower layer is completely covered by either the TaN lower electrode or the antioxidation/anti-diffusion insulation film, as shown in FIG. 1. The surface of the TaN lower electrode and the antioxidation/anti-diffusion insulation film are perfectly flat. For this reason, the insulation film formed thereon has excellent coating characteristics, does not require the use of CVD or another method that requires the thermal energy of decomposition, and can make use of sputtering or another method that can form the insulation film at a low temperature.

Therefore, in accordance with the capacitor structure of the present invention, short-circuiting does not occur between the upper and lower electrodes, and a capacitor element having stable characteristics can be incorporated into the copper wiring.

Next, FIG. 2 shows a cross-sectional view of the steps for implementing the embodiments of the present invention. Formed first is a lower wiring such as that shown in FIG. 2A. A barrier metal 104 and copper seed film (not shown) are formed by sputtering in the groove formed in the interlayer insulation film 102 and the via-cap film 101 of the lower layer. Embedded wiring 105 is formed by subsequently forming a copper film by electroplating, completely filling the groove formed as described above, and removing the surplus copper film by CMP. After CMP, the nitrogen processing is carried out for 30 minutes at 350° C. in order to stabilize the copper grain.

Figure 2A:
FIGS. 2A to 2J are cross-sectional diagrams showing, as a sequence of steps, an embodiment for forming a capacitor element incorporated in wiring according to the present invention.
Figure 2B:

An SiN or SiCN film is subsequently formed as a wiring cap film 103 that is designed to prevent copper oxidation and diffusion, and SiO₂ or SiOCH is formed as a hard mask 110, as shown in FIG. 2B.

Figure 2C:
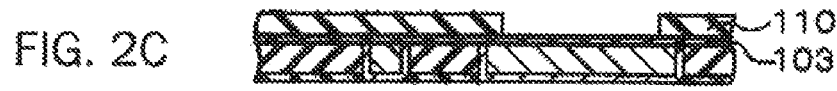

An aperture pattern is formed on the hard mask 110, as shown in FIG. 2C, by way of photolithography and etching steps. At this point, it is critical that etching on the wiring cap film 103 be stopped using the selective characteristics of dry etching. After the aperture pattern of the hard mask has been formed, the photoresist is removed by ashing. At this point, the copper surface of the lower layer is not exposed, and the oxidation of the copper by oxygen plasma can therefore be reduced.

Figure 2D:
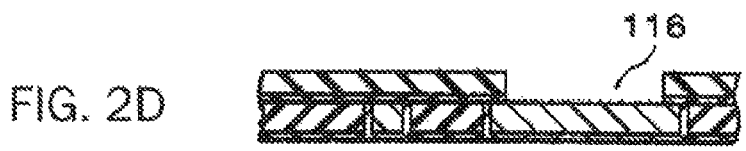

The aperture pattern of the hard mask 110 is used as a mask, and the wiring cap film 103 is etched. An aperture pattern 116 that reaches the copper surface of the lower layer is formed, as shown in FIG. 2D.

Figure 2E:
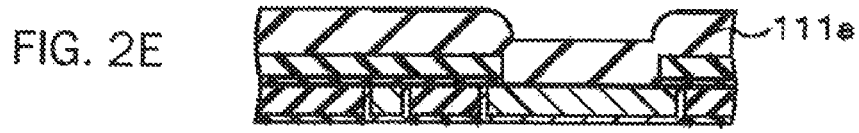
Figure 2F:

TaN is subsequently formed as a lower electrode 111a by sputtering, as shown in FIG. 2E; the aperture pattern 116 is completely filled in; and an embedded lower electrode 111b such as that shown in FIG. 2F is formed by using CMP to remove the TaN in areas other than the aperture portion. At this point, the remaining hard mask film may be completely removed and the wiring cap film 103 exposed. In this case, the combined thickness of the remaining hard mask film and the wiring cap is used as the thickness of the lower electrode 111b. FIG. 2F shows an example in which the film is cut until the wiring cap film 103 is exposed. As described above, the embedded lower electrode 111b may be formed so as to be in direct contact with the Cu wiring 105 of the lower layer. Copper is a soft material. Therefore, dishing tends to occur during CMP, and sunken areas are formed in the center area of patterns having a large surface area. For this reason, a copper wiring is difficult to form for patterns having a large surface area. However, TaN is a hard material, and such dishing is unlikely to occur. It is therefore a characteristic of this material that flat surface shapes can be achieved even with patterns having a relatively larger surface area.

Figure 2G:
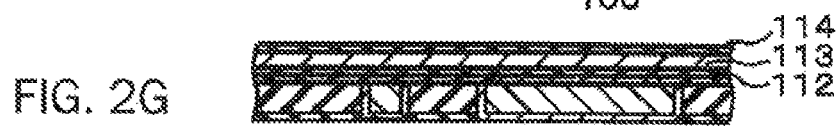
Figure 2H:
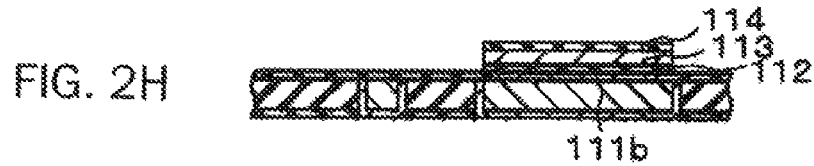

Next, the capacitor insulation film 112 is formed as an insulation film on the lower electrode 111b, as shown in FIG. 2G. In the present invention, the substrate surface on which the capacitor insulation film 112 is formed is made flat by embedding the lower electrode 111b in the wiring cap film 103 and exposing the surface of the film. For this reason, the coating characteristics are excellent, and the use of CVD and other methods that require high thermal energy for decomposition is not required. The thickness of the film can be easily managed by the use of sputtering or another physical vapor deposition method (PVD), and the thickness can be made uniform over the entire capacitor element. In cases in which the capacitor insulation film 112 is formed by sputtering, a technique may be used in which metallic material is formed into a film by DC sputtering, and a metal oxide film is then formed by thermal oxidation, or a technique may be used to directly form a metal oxide film using RF sputtering through the use of a target composed of an insulator. It is a characteristic of the present structure that such a metal oxide can be used as an insulation film, but the material used as the insulation film is not limited to a metal oxide, and SiO₂, SiN, SiC, SiCN, SiOC, SiOCE, and the like, which are widely used in LSI processes, may be formed as a film using plasma-assisted CVD at a substrate temperature of 300° C. to 400° C.

After the capacitor insulation film 112 is formed as described above, a TaN film, which is the same as the lower electrode 111b, is formed as the upper electrode 113 by reactive sputtering. An SiN or SiC film is formed as the capacitor cap film 114 on the upper electrode in the same manner as the insulation film formed on the wiring, and a capacitive layer film such as that shown in FIG. 2G is completed.

A capacitor cap film 114, upper electrode 113, and capacitor insulation film 112 are patterned into a shape that encloses the lower electrode 111b, as shown in FIG. 2E. The capacitor may be patterned by etching the capacitor insulation film using a photomask as the mask, and then ashing and etching the upper electrode 113 and capacitor insulation film 112 using the capacitor cap film 114 as a mask. As described above, the upper electrode 113 and capacitor insulation film 112 enclose the embedded lower electrode 111b. In other words, the upper electrode 113 and capacitor insulation film 112 are formed over an area that extends beyond the edge of the lower electrode 111b. It is accordingly a characteristic of the present structure that it is impossible for the upper electrode 113 and lower electrode 111b to short-circuit by way of the side wall of the capacitor insulation film 112.

Figure 2I:
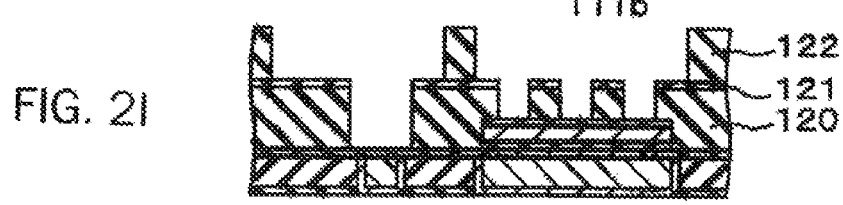
Figure 2J:
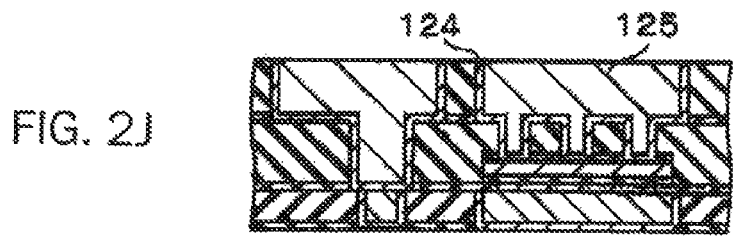

Next, $SiO_2$ or SiOCE is formed as the via-interlayer insulation film 120; SiN or SiCN is formed as the etching stopper film 121; $SiO_2$ or SiOCE is formed as the wiring interlayer insulation film 122; and grooves and via holes are formed for wiring formation. In this case, the characteristics of dry etching are used to stop the etching at the wiring cap film and the capacitor cap film 114, whereby a shape such as that shown in FIG. 2I is formed. At this point, the bottom of the via on the wiring of the lower layer, and the bottom of the upper-electrode contact of the capacitor are both protected by the cap film composed of the same type of material.

The cap films at the bottom of the upper-electrode contact and the bottom of the via are subsequently removed by etching back the entire surface to expose the upper electrode and the wiring of the lower layer.

Next, a barrier metal 124 and copper seed film (not shown) are formed by sputtering, and vias, contacts, and wiring grooves are completely filled by electroplating. Excess copper and barrier metal are thereafter removed from the insulation film by CMP, and the embedded wiring on the upper surface is formed to obtain the structure in FIG. 2J.

Described above is an example of the wiring and vias of the upper layer being formed by the dual damascene method, but the MIM capacitor of the present structure can be similarly formed using wiring that has been formed by the single damascene method. The present structure has the merit of being perfectly compatible with ordinary wiring vias and upper-electrode contacts because the lower electrode and lower-layer wiring are in direct contact, and the structure is characterized by being applicable to both single and dual damascene wiring structures.

Described below is an example of applying the capacitor structure of the present invention.

EXAMPLE 1

The method for incorporating a capacitor element mounted in an SRAM memory cell will be described as the first example with reference to FIGS. 3 to 6. FIGS. 3 and 4 are diagrams of the cross-sectional structure, but in order to efficiently express the steps and structure of the transistors and wiring, these diagrams do not follow the actual layout. Therefore, the description will be provided with reference to the actual layout of the cell shown in FIGS. 5 and 6.

Figure 3A:
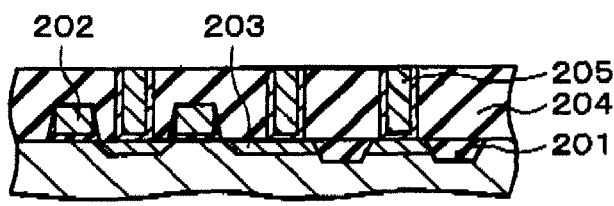
FIGS. 3A to 3G are cross-sectional diagrams showing, as a sequence of steps, the first example of the present invention.

A memory cell transistor composed of an element separation region 201, a diffusion layer 203, gates 202, and other components is formed, as shown in FIG. 3A. $SiO_2$ 204 is formed as an interlayer insulation film, and tungsten-filled contacts 205 are formed thereafter. The contacts are formed by etching and opening contact holes that reach the gate electrode and diffusion layer in the interlayer insulation film 204, forming a barrier metal film composed of a TiN/Ti layered film by sputtering, filling the contact holes by CVD using $WF_6$ as the starting material gas, and thereafter removing the excess w film and barrier metal on the interlayer insulation film 204 using CMP. The layout diagram formed to this point corresponds to FIG. 5A.

Figure 3B:
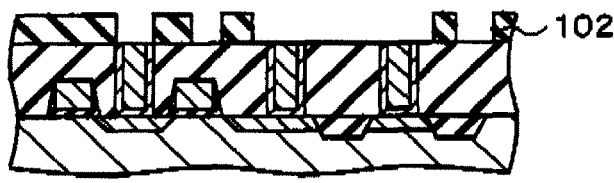
Figure 3C:
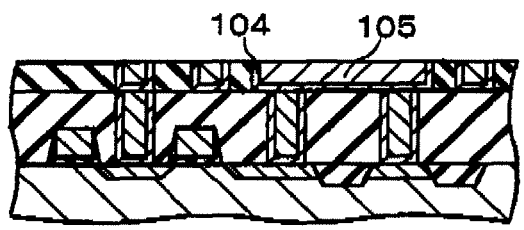
Figure 5A:
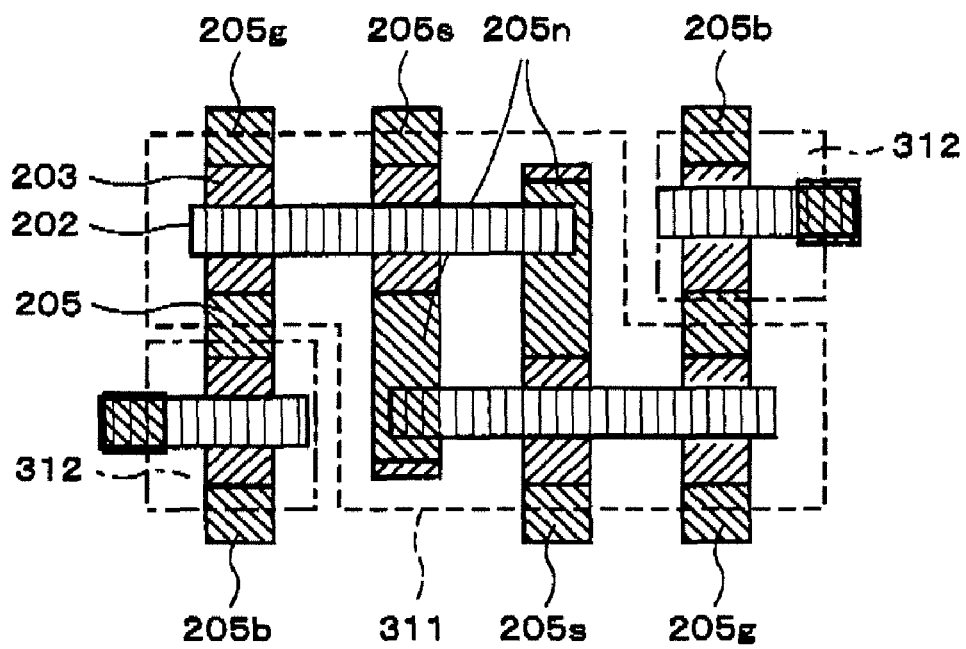
FIGS. 5A and 5B are plan views (layout) midway through the steps of the first example of the present invention.
Figure 5B:
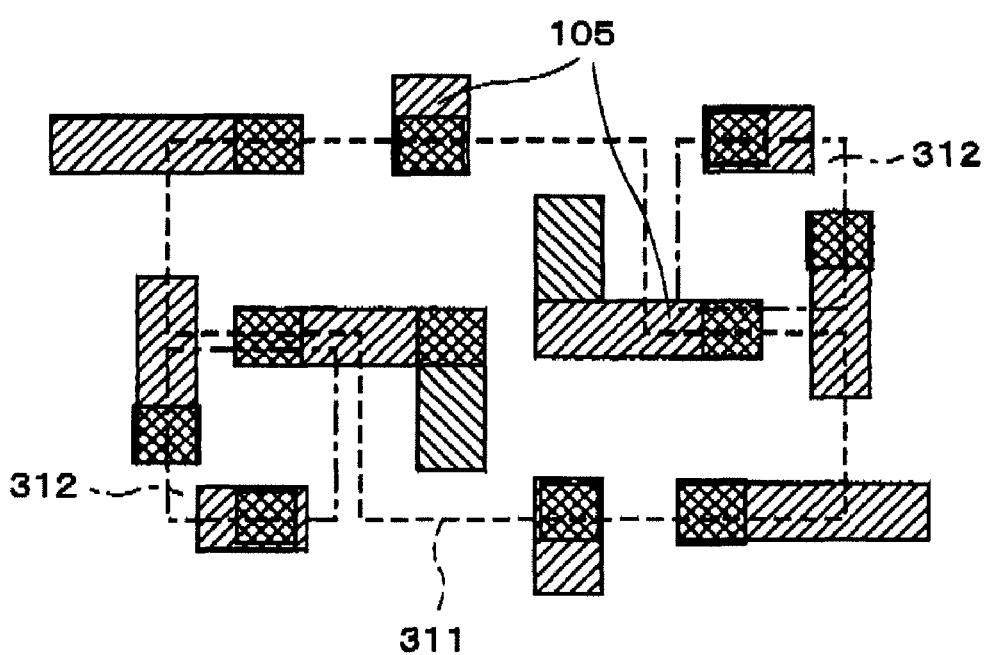

Next, $SiO_2$ is formed to a thickness of 200 nm as the interlayer insulation film 102 for forming the first wiring layer, and wiring grooves are formed by etching, resulting in the structure shown in FIG. 3B. Ta/TaN are then used to continuously form layered films of 10/10 nm as the barrier metal 104 by sputtering, and a copper seed film is formed to a thickness of 60 nm by sputtering. A copper film 105 is then formed by electroplating, and the excess copper and barrier metal on the insulation layer are removed by CMP, resulting in the first Cu wiring layer shown in FIG. 3C. FIG. 5B shows the layout formed up to this point. FIG. 5B shows only the contacts and the first wiring layer. Shown in this case is an example of using copper as the wiring material and using Ta/TaN as the barrier metal, but tungsten formed by CVD may be also used as the wiring material. In this case, TiN or TiN/Ti layered film is preferably used as the barrier metal.

Figure 3D:
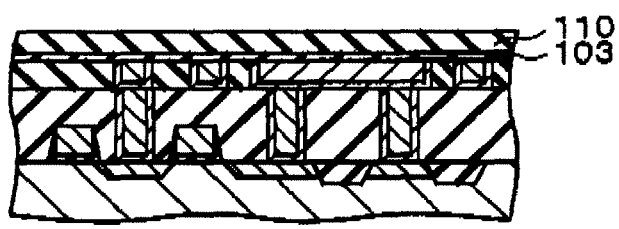

After the first wiring layer has been formed, an SiCn film is formed to a thickness of 30 nm as the wiring cap film 103, and an $SiO_2$ film is formed to a thickness of 100 mm as the hard mask 110 for the purpose of preventing the oxidation and diffusion of the copper wiring material, as shown in FIG. 3D.

Figure 3E:
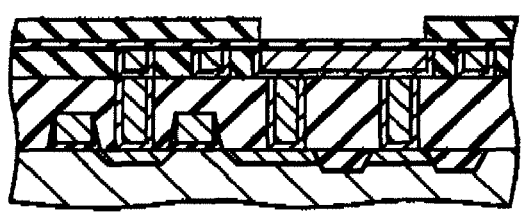

The hard mask 110 of the portion in which the capacitor lower electrode is formed is opened using a photoresist as a mask, and the resist is removed by ashing, as shown in FIG. 3E. When the hard mask is opened, the selective characteristics of dry etching must be used to stop the etching on the wiring cap film 103. After the hard mask aperture pattern has been formed, the photoresist is removed by ashing using oxygen plasma. At this point, however, since the copper surface of the lower layer is not exposed, the oxidation of the copper by oxygen plasma can be reduced. On the other hand, it is also possible to consider using a method for directly opening the wiring cap film 103 using a resist mask. In this case, however, the copper surface must be ashed in a state in which the surface is exposed in the opening of the wiring cap film 103, and the copper surface is oxidized in the resist peeling step in which oxygen plasma is used. The use of a hard mask process is therefore preferred.

Figure 3F:
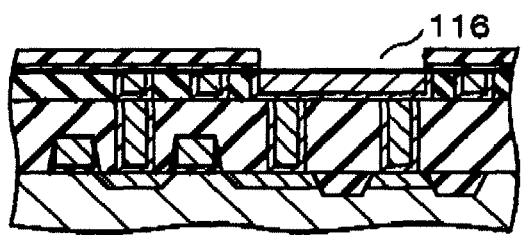

Next, the wiring cap film 103 is opened using the patterned hard mask as an etching mask, and the lower-layer wiring of the portion 116 that forms the capacitor lower electrode is exposed, as shown in FIG. 3F. A TaN film is then formed by sputtering to a thickness of 300 nm over the entire surface of the wafer, and the openings are completely filled in. Since Ta is a heavy element, the sputtered particles move in a very straight fashion, and a film is formed having excellent step coverage characteristics. It is accordingly characteristic of this method that the openings can be completely filled in without the use of special methods.

Figure 3G:
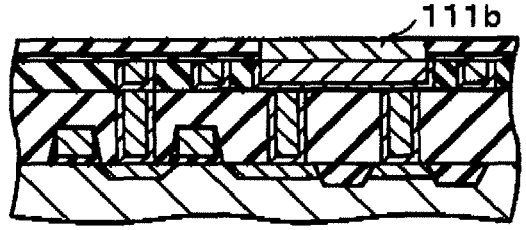
Figure 6A:
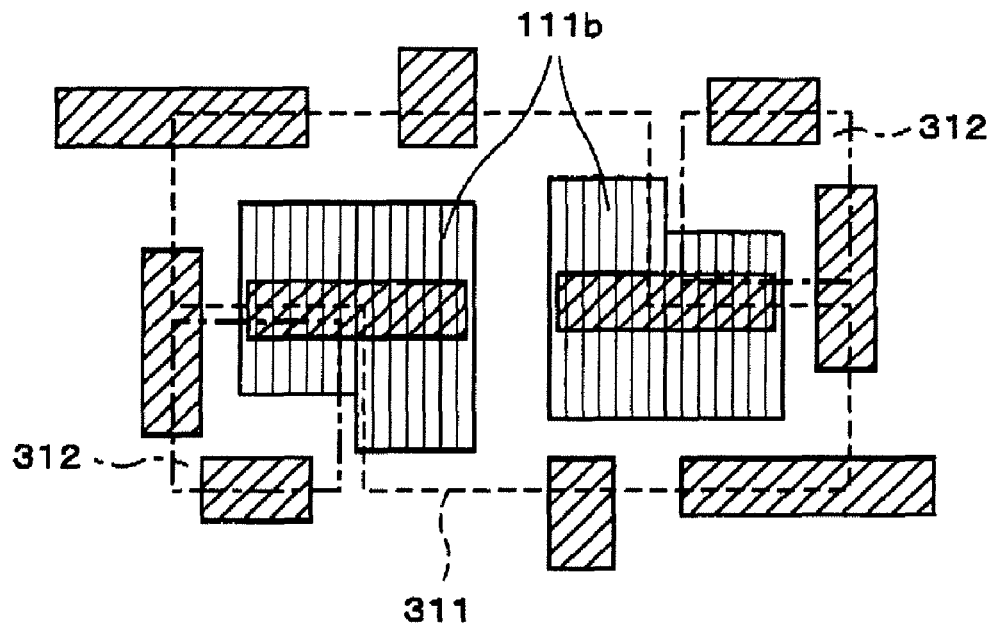
FIGS. 6A and 6B are plan views (layout) midway through the steps of the first example of the present invention.

The excess TaN is removed from the insulation film by CMP, and an embedded lower electrode 111b such as that shown in FIG. 3G is formed. In this situation, a portion of the hard mask 110 can be completely removed and a portion of the hard mask can be left behind. When a portion of the hard mask 110 is completely removed, it is possible that a portion of the wiring cap film will also be removed when the TaN film is subjected to CMP, and the distribution of the thickness of the wiring cap film is increased in the substrate plane. The wiring cap film 103 prevents copper from diffusing from the wiring, and when the film is locally thin, the reliability of the wiring is liable to be reduced due to copper diffusion. In anticipation of the film thickness being reduced during CMP, the wiring cap film 103 may be thickly grown in advance. On the other hand, in cases in which a portion of the hard mask is to be left behind when CMP is performed using TaN, the hard mask is made to conform to part of the interlayer film by the use of $SiO_2$ which is the same material as the hard mask and the via-interlayer insulation film 120 for via formation. Therefore, there is no concern that fluctuations will occur in the thickness of the hard mask film that is left behind during CMP. As a result, the wiring parameters can be maintained and wiring reliability can be preserved because the thickness of the wiring cap film can be kept constant. However, the remaining film of the hard mask 110 is preferably as thin as possible, and a thickness of 100 nm or less is preferred. In this case, the combined thickness of the wiring cap film and the remaining film of the hard mask is the thickness of the lower electrode. The thickness of the lower electrode is therefore preferably 30 nm or more and 80 nm or less. FIG. 6A shows the layout pattern formed up to this point. FIG. 6A shows only the first wiring pattern and the lower electrode pattern.

Figure 4H:
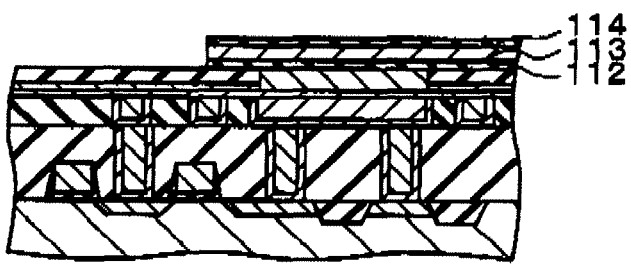
FIGS. 4H to 4L are cross-sectional diagrams showing, as a sequence of steps, the first example of the present invention, and are a continuation of the steps shown in FIGS. 3A to 3G.
Figure 7:
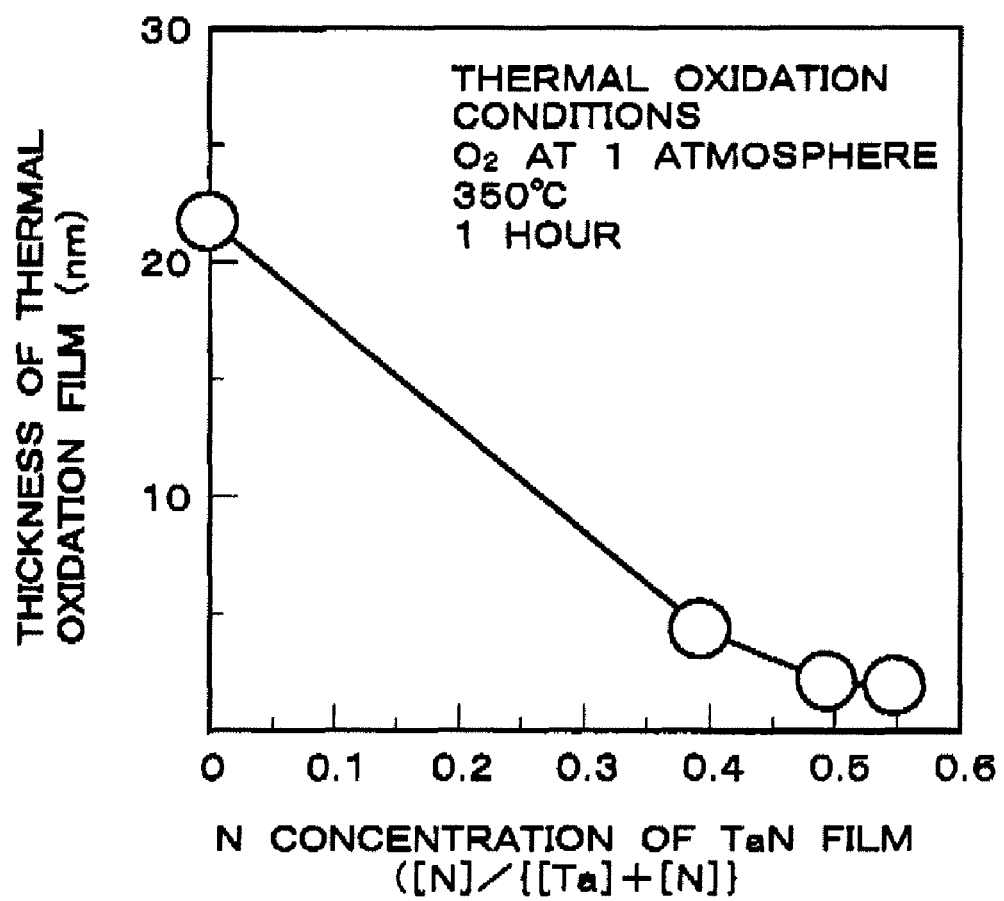
FIG. 7 is a diagram showing the oxidation characteristics of the Ta and TaN films in the first example of the present invention.

Next, the capacitor layer film is formed and patterned, as shown in FIG. 4H. Here, the method used for forming a capacitance film is one in which a Ta film is sputtered and thermally oxidized to obtain a TaO (Ta oxide) film. In the present structure, since a TaN film is used, as the lower electrode, data related to the oxidation characteristics, including the TaN film, was obtained. FIG. 7 shows a plot of the oxide film thickness (TaO film thickness) obtained after varying the N concentration in the TaN film and thermally oxidizing the film for 1 hour at 350° C. in an oxygen atmosphere. The graph shows that a TaO film having a thickness of 22 nm is obtained when the nitrogen concentration is 0, i.e., when the film is a Ta film, and that a sufficiently thick oxide film can be obtained by thermal oxidation at 350° C. It was confirmed that a TaO film having a thickness of 17 nm was obtained when the thermal oxidation was carried out for 30 minutes. Conversely, in the case that of TaN in which the nitrogen concentration was 50% or higher, the TaO film formed on the surface was very thin at 2 nm or less. This feature is very important and when the metallic oxide is formed on the TaN, only about 2 nm of the TaN is oxidized at most. Therefore, the electrical conductivity of the electrode can be reliably assured and the thickness of the insulation film can be more easily managed.

Figure 8:
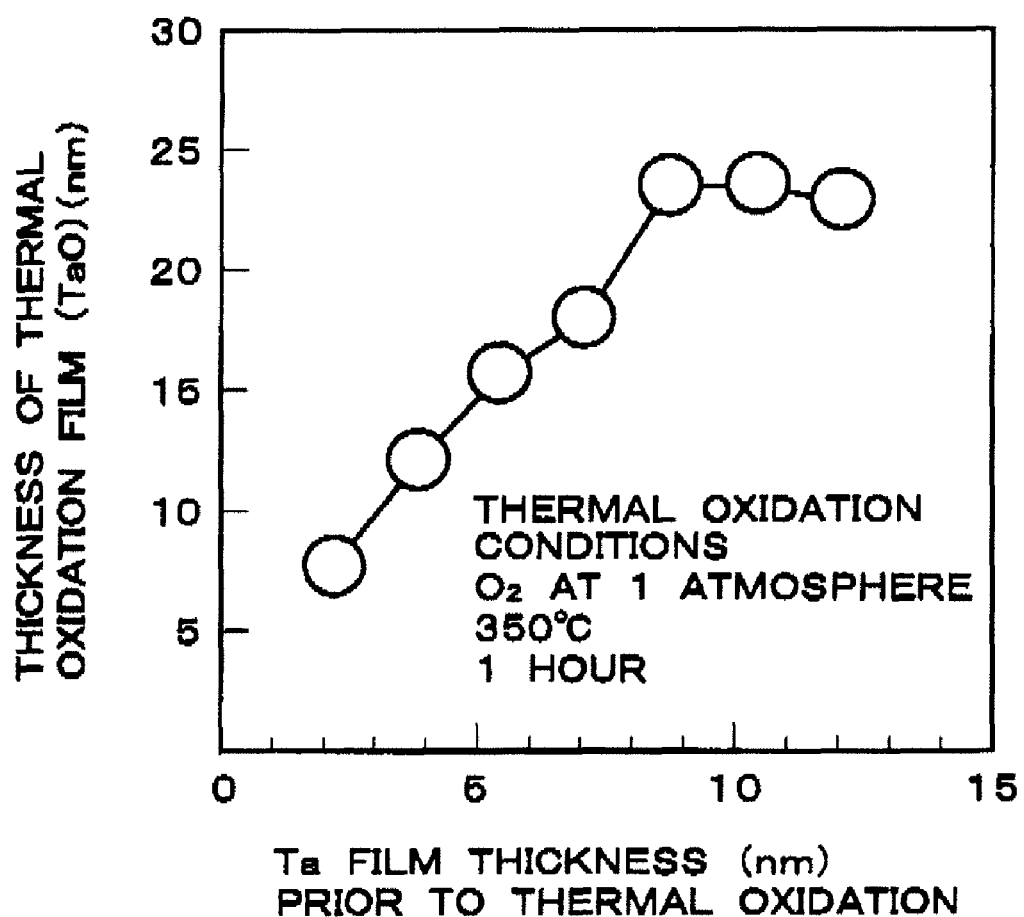
FIG. 8 is a diagram showing the relationship between the thickness of the Ta film prior to thermal oxidation and the thickness of the thermal oxide film (TaO) after 1 hour of thermal oxidation at 350° C. in the first example of the present invention.

FIG. 8 shows a plot of the TaO film thickness obtained after varying the thickness of the TaN film sputtered onto a TaN lower electrode and thermally oxidizing the film for 1 hour at 350° C. The graph shows that when the Ta film is 9 nm or less prior to thermal oxidation, the thickness of the TaO film after thermal oxidation increases monotonically, but tends to reach saturation when the thickness of the Ta film prior to thermal oxidation is greater than 9 nm. The thickness at which the TaO film reaches saturation is about 23 nm. It is apparent from FIG. 7 that the thickness of the thermally oxidized film is 22 nm when the thermal oxidation is performed for 1 hour at 350° C. These results are reasonable, considering that the TaN lower electrode surface is slightly oxidized. These results show that the thickness of the resulting TaO film can be controlled by setting the film thickness during sputtering of the initially formed Ta film.

Figure 9:
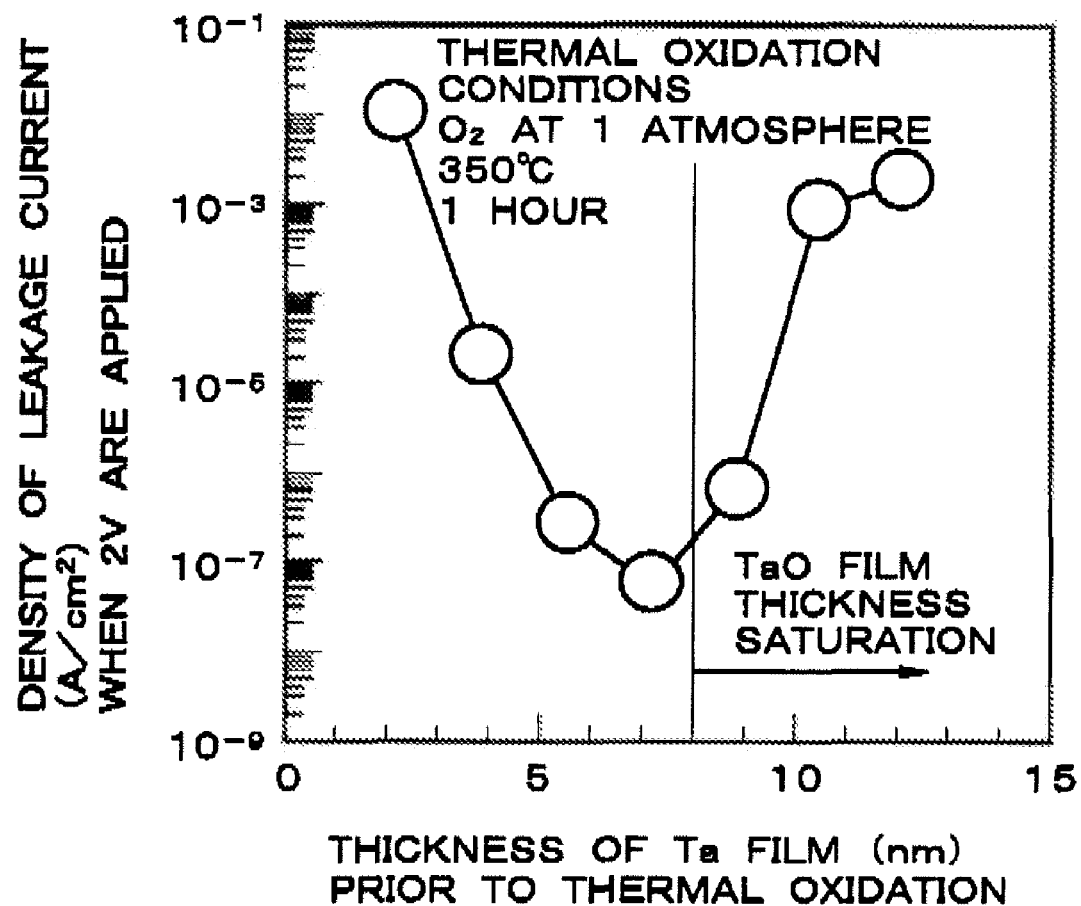
FIG. 9 is a diagram showing the relationship between the thickness of the Ta film prior to thermal oxidation and the leakage current of the TaO film formed by thermal oxidation in the first example of the present invention.
Figure 10:
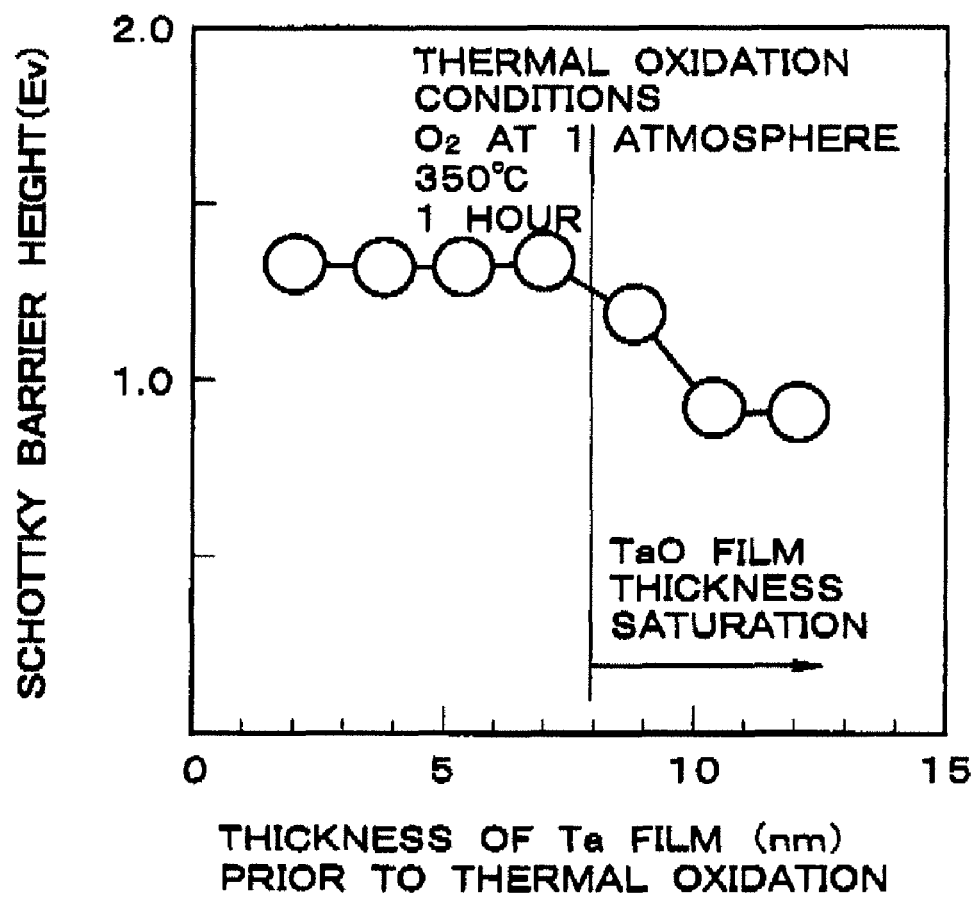
FIG. 10 is a diagram showing the relationship between the thickness of the Ta film prior to thermal oxidation and the Schottky barrier height in the interface between the lower electrode and the TaO film formed by thermal oxidation in the first example of the present invention.

It is important in capacitor elements that the insulation characteristics be sufficiently assured. FIG. 9 shows a plot of a leakage current obtained with the application of a bias in which electrons are supplied from the lower electrode for each of the films obtained in FIG. 8. In areas where the thickness is low, an increase in the leakage current is observed due to stronger electric field intensity. The leakage current also increases when the Ta film thickness prior to thermal oxidation is considerable. Areas where the leakage current increases due to film thickness are areas in which the TaO film thickness reaches saturation after thermal oxidation, and the boundary on the lower electrode side of the TaO film is composed of Ta. For this reason, a difference in the leakage current can be observed in a bias such as when electrons are supplied from the lower electrode side. A reason for this may be that the barrier height for the electrons varies depending on the lower electrode material. In order to demonstrate this, the result of estimating the barrier height from the fitting produced by a Schottky electric current model is shown in FIG. 10. It is apparent from the diagram that the barrier height is reduced in areas (Ta film thickness of 9 nm or more prior to thermal oxidation) in which the thickness of the TaO film has reached saturation. Thus, the difference in barrier height reflects the difference in the work function of the electrode material. The work function of the Ta is 4.1 eV, and the work function of the TaN is 4.8 eV. The greater work function of the TaN produces higher barrier height. Based on the above results, it is clear that TaN is more suitable than Ta as an electrode material.

A Ta film is formed to a thickness of 4 nm by sputtering, and a TaO film is formed to a thickness of 12 nm as the capacitor insulation film 112 by thermally oxidizing the film for 1 hour in an oxygen atmosphere at 350° C. A TaN film is subsequently formed to a thickness of 50 nm as the upper electrode 113 by reactive sputtering. Lastly, SiN or SiCN film is formed to a thickness of 30 nm as the capacitor cap film 114. The thicknesses of the capacitor cap film 114 and the wiring cap film 103 are preferably made the same.

Figure 6B:
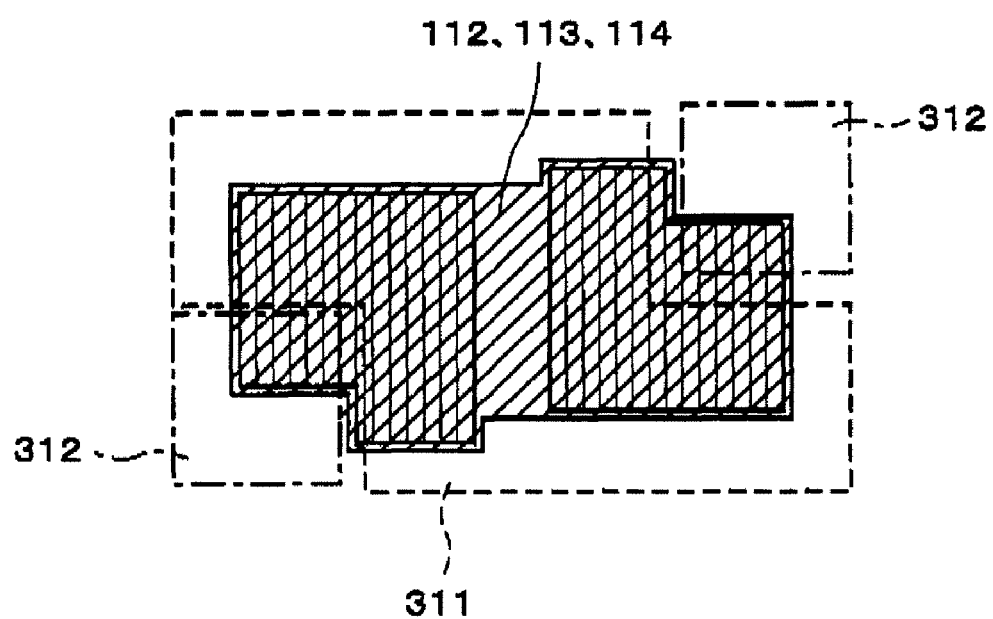

The capacitor cap film 114, upper electrode 113, and capacitor insulation film 112 were subsequently patterned. This patterning may be carried out by patterning all the films in a single photolithographic step using a photoresist. Alternatively, the capacitor cap film alone may be patterned using a resist, and the lower electrode film and capacitor insulation film may be patterned after ashing. Another alternative is to etch the lower electrode and the capacitor cap film using a resist mask, perform ashing, and then pattern the capacitor insulation film. FIG. 6B shows the layout pattern formed to this point.

Figure 4I:
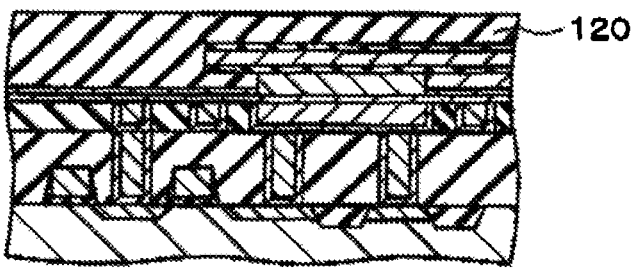
Figure 4J:
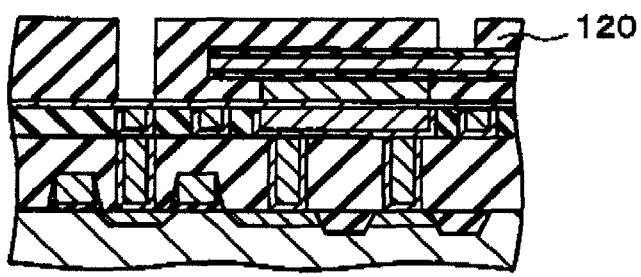

An $SiO_2$ film may be formed to 200 nm as the via-interlayer insulation film 120 for forming the first via, as shown in FIG. 4I. The holes for the via and upper-electrode contact are subsequently formed, and the holes are formed so as to reach the wiring cap and capacitor cap films in the interlayer insulation film 120 using a photoresist as a mask. In this case, it is important to completely stop the etching at the cap films by using the selective characteristics of dry etching, as shown in FIG. 4J.

Figure 4K:
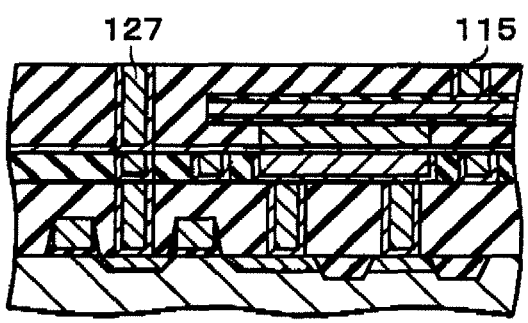

The wiring cap and the capacitor cap are etched by etching back the entire surface to expose the lower-layer wiring and the upper electrode. Ta/TaN films are sputtered to a thickness of 10/10 nm as a barrier metal in the same manner as in ordinary copper wiring processes, and a copper seed film is subsequently sputtered to a thickness of 60 mm. A copper film is then formed to a thickness of 500 nm by electroplating, and the excess copper film and barrier metal are removed from the interlayer insulation film 120 by CMP, whereby a copper via 127 and a copper contact 115 such as that shown in FIG. 4K are formed. In this case, copper is used as the via-filling and contact-embedding material, but tungsten may also be used. In this case, TiN or TiN/Ti layered film are preferably used as the barrier metal.

Figure 4L:
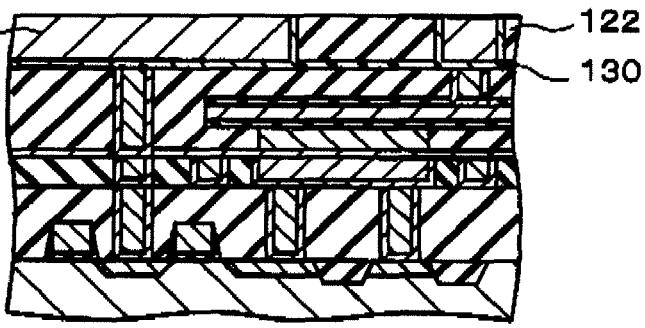

Next, a via-cap film 130 and wiring interlayer film 122 are formed, a wiring groove pattern is formed, and a wiring structure 128 is thereafter formed in accordance with ordinary single damascene methods, as shown in FIG. 4L. Multilayer wiring is then formed as required and peripheral circuits are wired, cells are connected, and other procedures are carried out to complete the SRAM device.

EXAMPLE 2

Figure 11A:
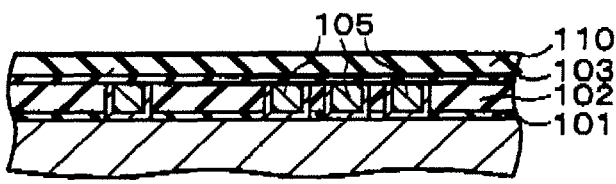
FIGS. 11A to 11H are cross-sectional diagrams showing, as a sequence of steps, the second example of the present invention.

An MIM capacitor structure formed on a wiring upper layer will be described as a second example with reference to FIG. 11. MIM capacitors used for decoupling purposes and employed in RF circuits and analog circuits require large capacitance, so the surface area must necessarily be considerable. Since lower-layer wiring has a small pitch and the wiring is very densely formed, the placement of a capacitor element having a large surface area is difficult. An MIM capacitor that is used in such applications must therefore be formed on the upper-layer portion of the wiring. The wiring of the upper-layer portion is formed to a considerable thickness, but with copper wiring, there is the problem of dishing during CMP, and limits are often imposed on the surface area. In view of the above, wiring that has been divided as shown in FIG. 11A is preferably used as the lower-layer wiring 105. In this structure, 101 is a lower layer via cap composed of SiN or SiCn and formed to a thickness of 100 nm, 102 is a wiring interlayer insulation film composed of $SiO_2$ or SiOCH and formed to a thickness of 1 μm, and 103 is a wiring cap insulation film composed of SiN or SiCn and formed to a thickness of 100 nm. Additionally, 110 is a hard mask required for forming apertures in which a capacitor lower electrode is formed in the wiring cap 103. The mask is composed of $SiO_2$ or SiOCH and formed to a thickness of 100 nm. In FIG. 11, the step for forming a lower layer transistor and the step for forming a multilayer wiring thereon have been omitted. In the present structure, the capacitor is preferably formed on the upper portion of the wiring, but it is also possible to form the capacitor in an intermediate layer.

Figure 11B:
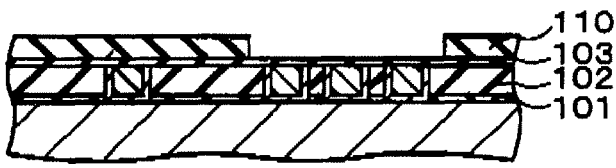
Figure 11C:
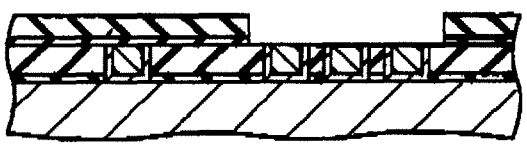

The wiring cap 103 and hard mask 110 are formed on the lower-layer wiring, as shown in FIG. 11A; the hard mask 110 on the lower electrode formation area is thereafter etched using a resist mask; and a hard mask pattern such as that shown in FIG. 11B is formed. At this point, the etching is automatically stopped on the wiring cap 103 using the selective characteristics of dry etching. Ashing is carried out after hard mask etching, an aperture in the wiring cap film is formed, and the upper surface of the lower wiring that connects to the lower electrode is exposed, as shown in FIG. 11C. After the aperture pattern in the hard mask has been formed, the photoresist is removed by ashing using oxygen plasma. However, since the copper surface of the lower layer has not been exposed at this point, oxidation of the copper by the oxygen plasma can be reduced. On the other hand, it is also possible to consider using a method in which the wiring cap film 103 is directly opened using a resist mask rather than a hard mask. In this case, however, ashing must be carried out in a state in which the copper surface is exposed in the wiring cap film 103 aperture, and the copper surface becomes oxidized in the resist removal step in which an oxygen plasma is used. Therefore, a hard mask process is preferably used.

Figure 11D:
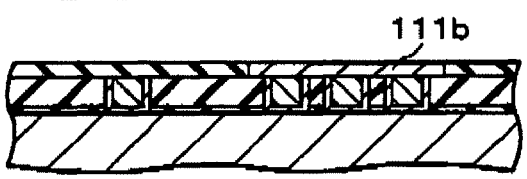

A TaN film is then formed to a thickness of 400 nm using reactive sputtering, the apertures formed in the wiring cap and hard mask are completely filled in, the TaN film is thereafter completely removed from the insulation film by CMP, and a lower electrode 111b such as that shown in FIG. 11D is formed. In this situation, a portion of the hard mask 110 may be completely removed or a portion of the hard mask may be left behind. When a portion of the hard mask 110 is completely removed, it is possible that a portion of the wiring cap film will also be removed when the TaN film is subjected to CMP, and the distribution of the thickness of the wiring cap film is increased in the substrate plane. The wiring cap film 103 prevents copper from diffusing from the wiring, and when the film is locally thin, the reliability of the wiring is liable to be reduced due to copper diffusion. In anticipation of the film thickness being reduced during CMP, the wiring cap film 103 may be thickly grown in advance. On the other hand, when the TaN film undergoes CMP and a portion of the hard mask is to be left behind, the hard mask is made to conform to a portion of the interlayer film by the use of $SiO_2$, which is the same material as the hard mask and the via-interlayer insulation film 120 for via formation. Therefore, there is no concern that fluctuations will occur in the thickness of the hard mask film that is left behind during CMP. As a result, the wiring parameters can be maintained and wiring reliability can be preserved because the thickness of the wiring cap film can be kept constant. However, the remaining film of the hard mask 110 is preferably made as thin as possible. In this case, the combined thickness of the wiring cap film and the remaining film of the hard mask is the thickness of the lower electrode.

Figure 11E:
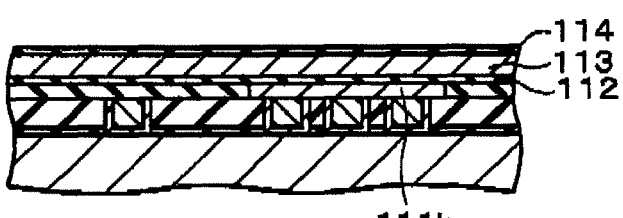

Next, the capacitor layer film shown in FIG. 11E is formed, Reactive Sputtering is an effective method whereby a capacitor insulation film having a high dielectric constant can be formed at a low temperature. In reactive sputtering that uses $Ar/O_2$ gas, a metallic oxide film can be formed without heating the substrate. The merit of sputtering is that any insulation film can be formed as long as a target is provided.

Figure 12:
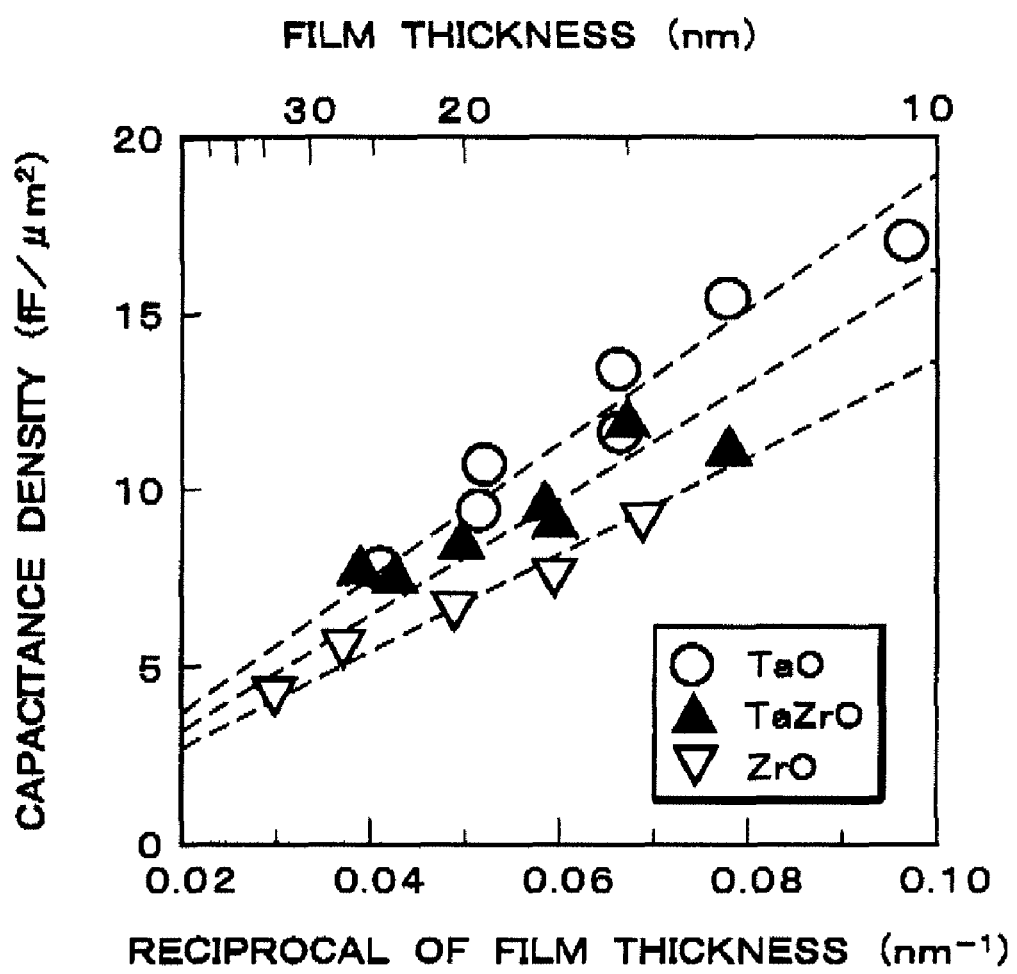
FIG. 12 is a diagram showing the relationship between the film thickness and the capacitive density of ZrO, TaO, and the mixed crystal of the two formed by sputtering in the second example of the present invention.

FIG. 12 is a plot of the capacitive density in films formed by sputtering from tantalum oxide (TaO), zirconium oxide (ZrO), and a mixed crystal material ($Ta_{0.9}Zr_{0.1}O$, $Ta_{0.2}Zr_{0.8}O$) at each film thickness. From the slope of the plot, the dielectric constants of these films are 21 for TaO, 18 for $Ta_{0.9}Zr_{0.1}O$, 17 for $Ta_{0.2}Zr_{0.8}O$, and 15 for ZrO. A metallic insulation film can be formed having any dielectric constant between 15 and 21 by mixing TaO and ZrO in an arbitrary ratio.

The leakage current at the high temperature of 85° C. or 125° C. is also a very important factor when reliability in an LSI is considered.

Figure 13:
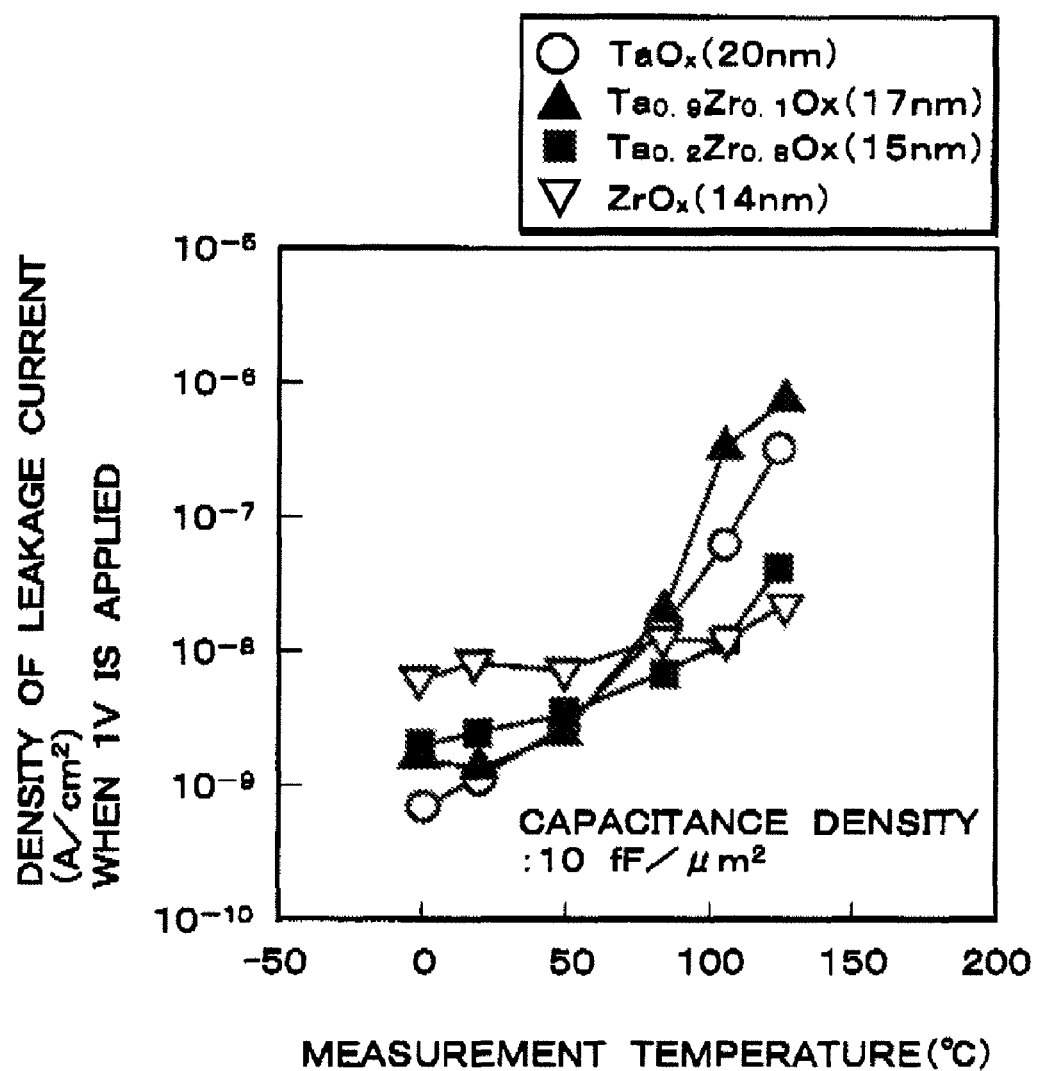
FIG. 13 is a diagram showing the relationship between the temperature during electric current measurement and the leakage current of ZrO, TaO, and the mixed crystal of the two formed by sputtering in the second example of the present invention.
Figure 14:
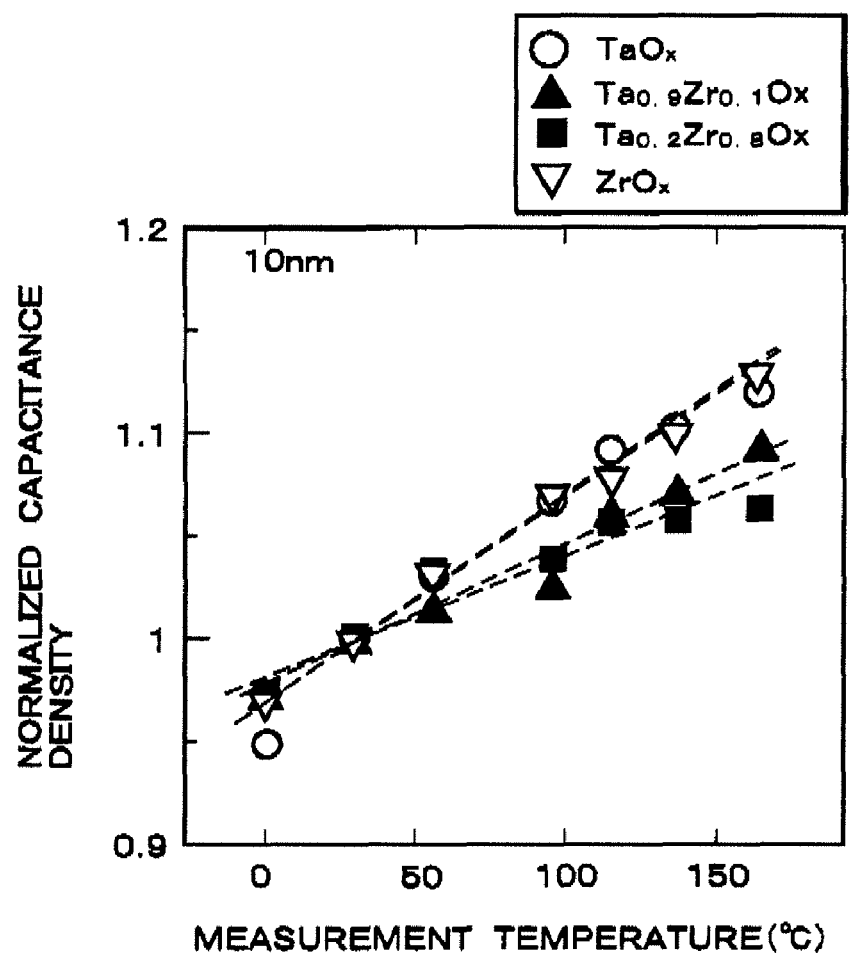
FIG. 14 is a diagram showing the relationship between the temperature during capacitance measurement and the normalized (reference temperature: 25° C.) capacitance of ZrO, TaO, and the mixed crystal of the two formed by sputtering in the second example of the present invention.

As described above, the leakage current of the TaO capacitor represents conduction that is based on thermal activation whose rate is limited by the barrier height, and there is a risk that the leakage current may degrade at high temperatures. FIG. 13 is a plot of the leakage current density observed when 1 V is applied to insulation films having substantially the same capacitive density. In the graph, the horizontal axis is the measurement temperature. Dramatic material dependence is not observed in the leakage current in the vicinity of room temperature, but the leakage current tends to decrease from TaO toward ZrO at high temperatures. This difference is based on the electron affinity of the materials. The electron affinity of non-crystalline materials is not well known, but in the case of crystalline $Ta_2O_5$, the affinity is 3.2 eV, and in the case of ZrO, the affinity is 2.5 eV. Since the electron affinity of $Ta_{0.2}Zr_{0.8}O$ and ZrO is very low, it is known that the level of leakage current is determined by the conduction mechanism of the Poole-Frankel mode in which electron is released from a trap, rather than by the barrier height of the boundary. FIG. 14 shows the dependency of the normalized capacitance density on the measurement temperature, wherein the capacitance measured as 25.degree. C. is used, as a reference. In the case of TaO and ZrO, the temperature dependencies are substantially the same, but the capacitance variation with respect to the temperature is lower in the case of a mixed crystal.

From the results above, in a TaO—ZrO mixed crystal system, the TaO is most optimal from the standpoint of the dielectric constant, and ZrO is most optimal in terms of insulation characteristics at high temperature. It is effective to use a mixed crystal material in applications that require the temperature dependency of the capacitance value to be kept low. A suitable film composition can therefore be used in accordance with the intended application.

A TaZrO film is formed to a thickness of 10 nm as the capacitor insulation film 112 using reactive sputtering, an upper electrode TaN 113 film is formed to a thickness of 50 nm, also by reactive sputtering, and lastly, an SiN or SiCN film is formed to a thickness of 100 nm as the capacitor cap film 114. The thicknesses of the capacitor cap film 114 and wiring cap film 103 are preferably made the same.

Figure 11F:
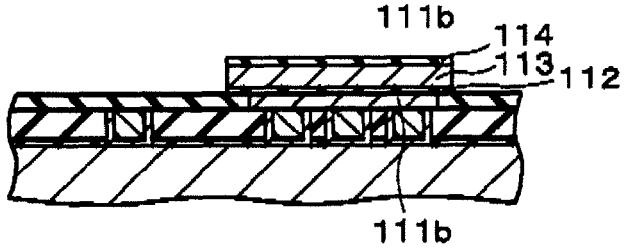

A capacitor cap film, upper electrode, and capacitor insulation film are subsequently patterned so as to enclose the lower electrode pattern, as shown in FIG. 11F. This patterning may be carried out by patterning all the films in a single photolithographic step using a photoresist. Alternatively, the capacitor cap film alone may be patterned using a resist, and the lower electrode film and capacitor insulation film may be patterned after ashing. Another alternative is to etch the lower electrode and the capacitor cap film using a resist mask, perform ashing, and then pattern the capacitor insulation film.

Figure 11G:
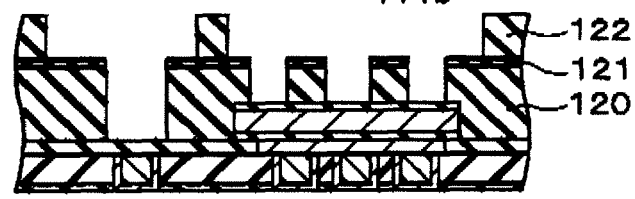
Figure 11H:
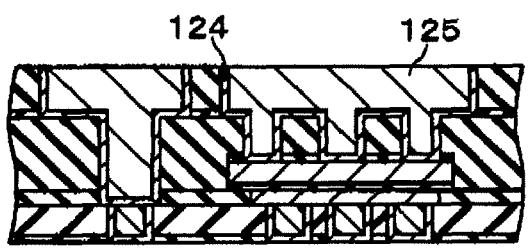

The via-interlayer insulation film 120, intermediate etching stopper film 121, and wiring interlayer insulation film 122 are formed after the capacitor has been patterned, and via holes and wiring grooves are formed in order to form dual damascene wiring. At this point, the selective characteristics of dry etching are used to stop the etching on the wiring cap and capacitor cap film composed of the same material and formed to the same thickness, as shown in FIG. 11G.

The wiring cap and capacitor cap films are subsequently removed by etching back the entire surface to expose the upper electrode and the wiring of the lower layer. A barrier metal is thereafter sputtered and the holes and grooves thus formed are completely filled using copper according to the MOCVD method. Lastly, the excess copper film and barrier metal formed on the insulation film is removed by CMP to form an upper-layer wiring 125 such as that shown in FIG. 11H. Multilayer wiring may thereafter be formed as required.

EXAMPLE 3

Figure 15:
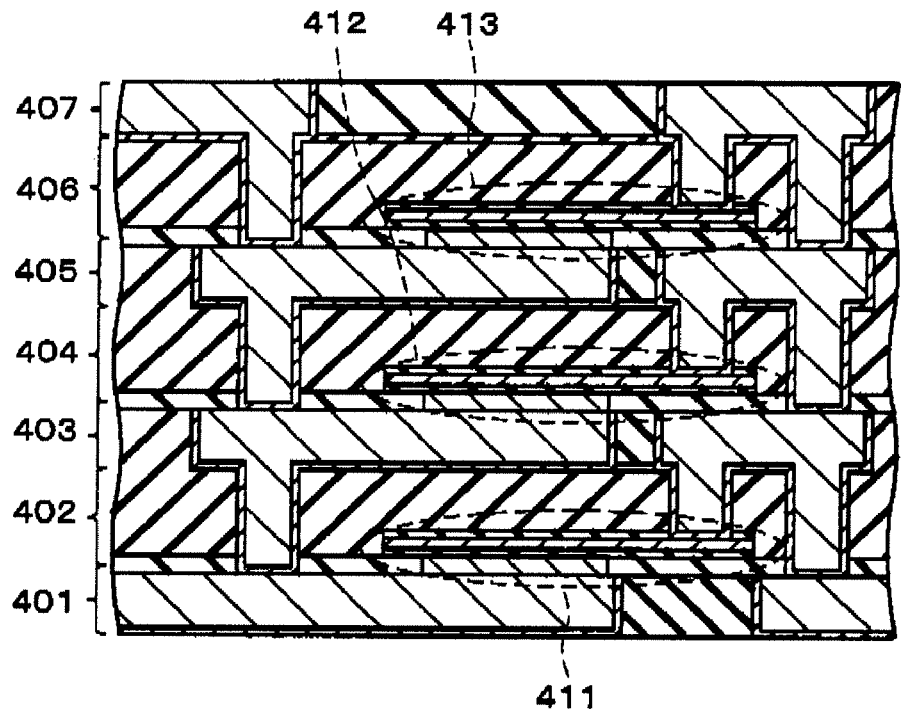
FIG. 15 is a cross-sectional diagram showing the structure of the third example of the present invention.
Figure 20:
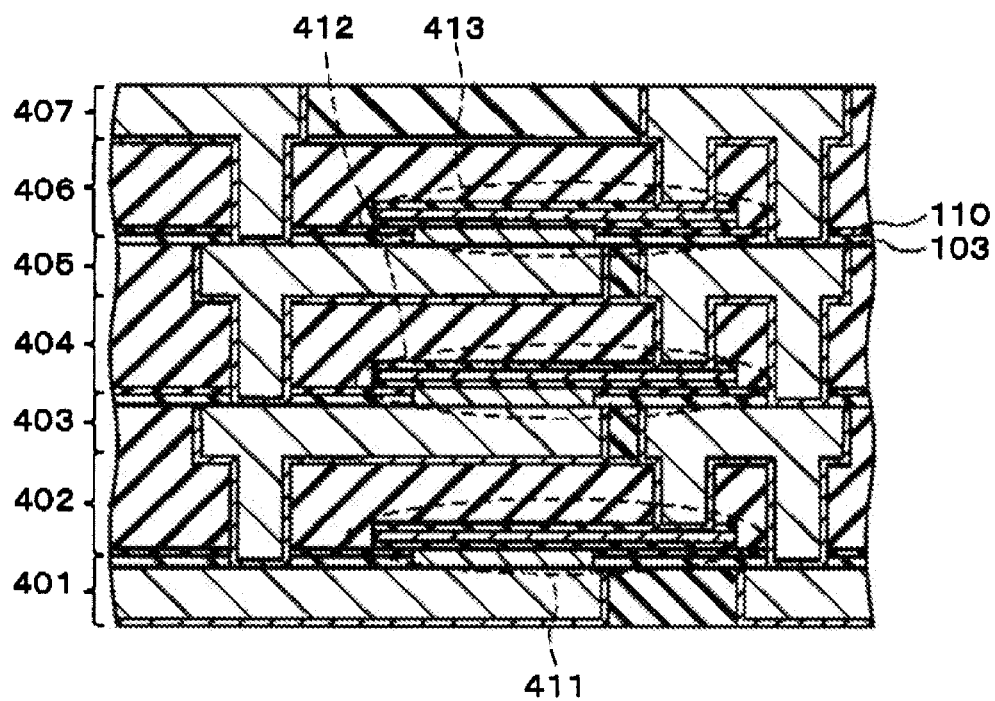
FIG. 20 is a cross-sectional diagram showing the structure of the third example of the present invention.

FIG. 15 shows a structure in which a capacitor element is incorporated into multilayered wiring on the basis of a third example. The bottommost wiring layer 401 shown in the diagram is not necessarily limited to being the first wiring layer in an actual semiconductor device, and the layer may be an arbitrary wiring layer. However, for the sake of convenience, the layer will be referred to as the first wiring layer. It will also be assumed that 402 is a first via layer, 403 is a second wiring layer, 404 is a second via layer, 405 is a third wiring layer, 406 is a third via layer, and 407 is a fourth wiring layer. In the structure of the present example, three layers of embedded lower electrodes are present from among the four wiring layers described above, as indicated by the reference numerals 411, 412, and 413, and multiple layers of capacitor elements are incorporated in a layout in which the capacitor insulation film, upper electrode, and capacitor cap film enclose the embedded lower electrode. The capacitor element of each layer is formed using the method described in the first and second examples. The lower electrodes of the capacitor elements of the layers are connected in parallel by way of connected lower-layer wirings and vias, and the upper electrodes of the capacitor elements of the layers are connected in parallel by way of the upper-electrode contacts, upper wiring layers, and vias. In accordance with the present example, the capacitance value can be increased without increasing the layout surface area by disposing the capacitor elements in multiple layers. The number of layers of capacitor elements is not limited to three, and a multilayered structure having any number of layers may be formed. FIG. 20 explicitly shows a portion in which embedded lower electrodes are formed in a bilayer structure of a wiring cap film 103 and a hard mask 110 for processing the wiring cap. The hard mask and via-interlayer films are composed of the same material, and the hard mask is thereby made to substantially conform to the via-interlayer films to form the structure shown in FIG. 15.

Figure 16:
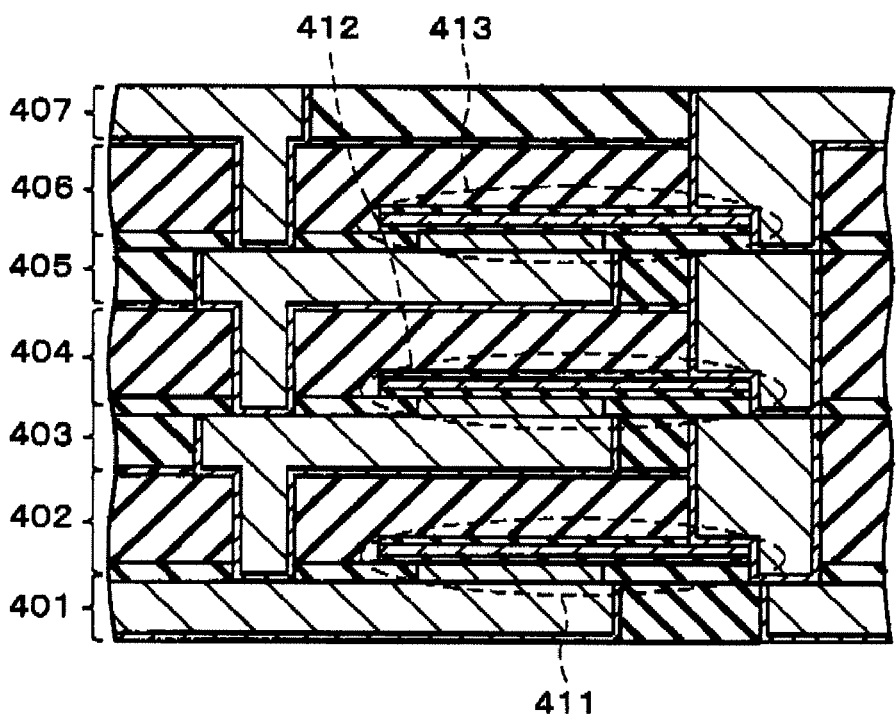
FIG. 16 is a cross-sectional diagram showing the structure of the third example of the present invention.
Figure 21:
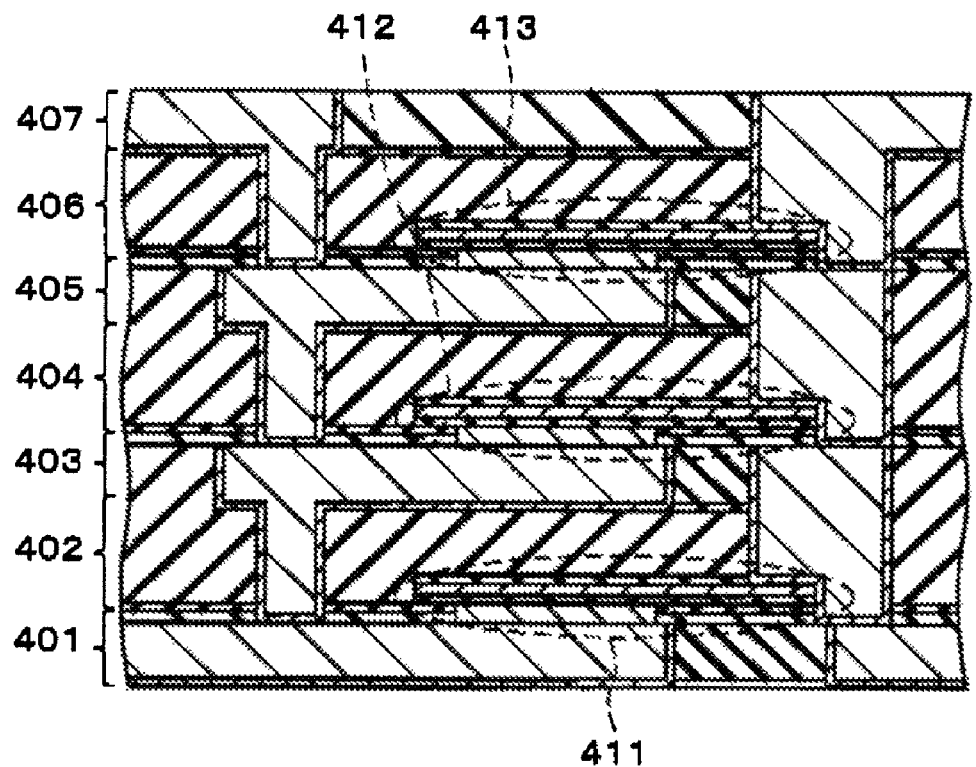
FIG. 21 is a cross-sectional diagram showing the structure of the third example of the present invention.

FIG. 16 shows a modified example of the third example. Featured in the present modified example is a situation in which the boundary has been eliminated between the contact plugs and the wiring via-plugs for forming a parallel connection for the upper electrodes of the capacitors formed in multiple layers. In the modified example, there is no requirement that a fine pattern be formed as the contacts and vias, and the configuration is also effective in reducing the resistance of the wiring for connecting the upper electrodes. The characteristic of the capacitor element structure of the present invention is that the lower electrodes are embedded, and the present structure is also characterized in that the upper and lower electrodes do not short-circuit even if the shared plugs for the contacts and vias are formed. The present structure cannot be implemented when the lower electrodes are patterned using conventional etching processes. FIG. 21 explicitly shows that the portion in which the lower electrodes have been embedded have a bilayer structure composed of a wiring cap film and a hard mask for processing the wiring cap. The hard mask and via-interlayer films are composed of the same material, and the hard mask is thereby made to substantially conform to the via-interlayer films to form the structure shown in FIG. 16.

EXAMPLE 4

Figure 17:
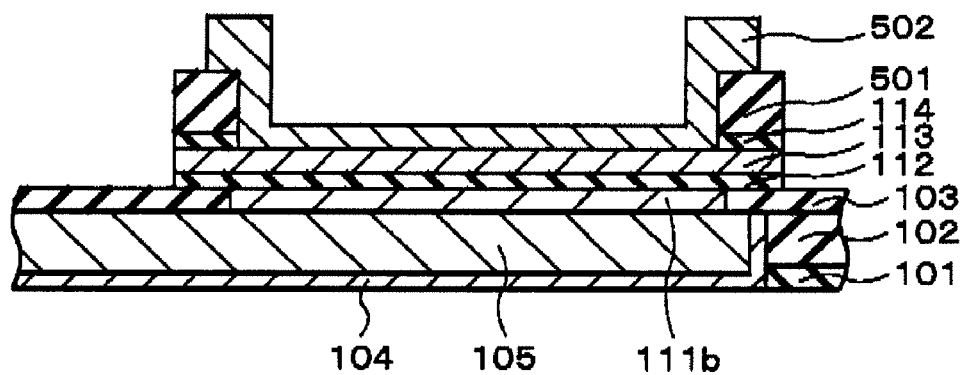
FIG. 17 is a cross-sectional diagram showing the structure of the fourth example of the present invention.
Figure 22:
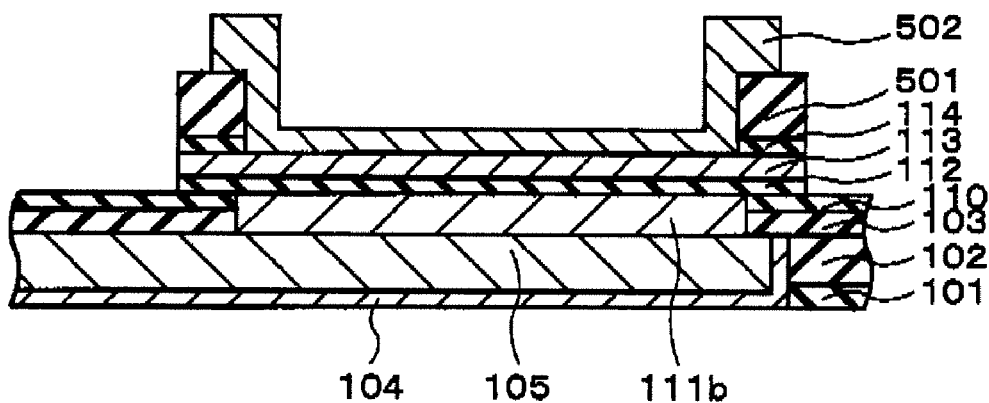
FIG. 22 is a cross-sectional diagram showing the structure of the fourth example of the present invention.

FIG. 17 shows a structure in which a capacitor element has been inserted between the uppermost wiring layer and the pad metal in a fourth example. In the present example, the wiring layers (wiring 105, barrier metal 104, interlayer insulation film 102, and wiring cap film 103) that are arranged on the lower layer of the capacitor element are the topmost wiring layers in an LSI. A capacitor insulation film 112, an upper electrode 113, and a capacitor cap 114 are formed on the lower electrode 111b embedded in the wiring cap in a shape that encloses the lower electrode. A passivation film 501 for covering the entire chip is formed on the films. An aperture that passes completely through the passivation film 501 and the capacitor cap film 114 is formed, and a pad 502 fashioned from a metal that is primarily composed of aluminum is formed thereafter. The pad 502 is in direct contact with the upper electrode 113 in the capacitance area and is in direct contact with the topmost wiring layer in areas in which the capacitor element is not present. The pad 502 primarily composed of aluminum may be accompanied by a barrier metal composed a Ti film, a TiN film, or a layered combination of these two films. FIG. 22 explicitly shows the portion in which an embedded lower electrode is formed in a bilayer structure of a wiring cap film 103 and a hard mask 110 for processing the wiring cap. The hard mask and via-interlayer films are composed of the same material, and the hard mask thereby substantially conforms to the via-interlayer films to form the structure shown in FIG. 17.

EXAMPLE 5

Figure 18:
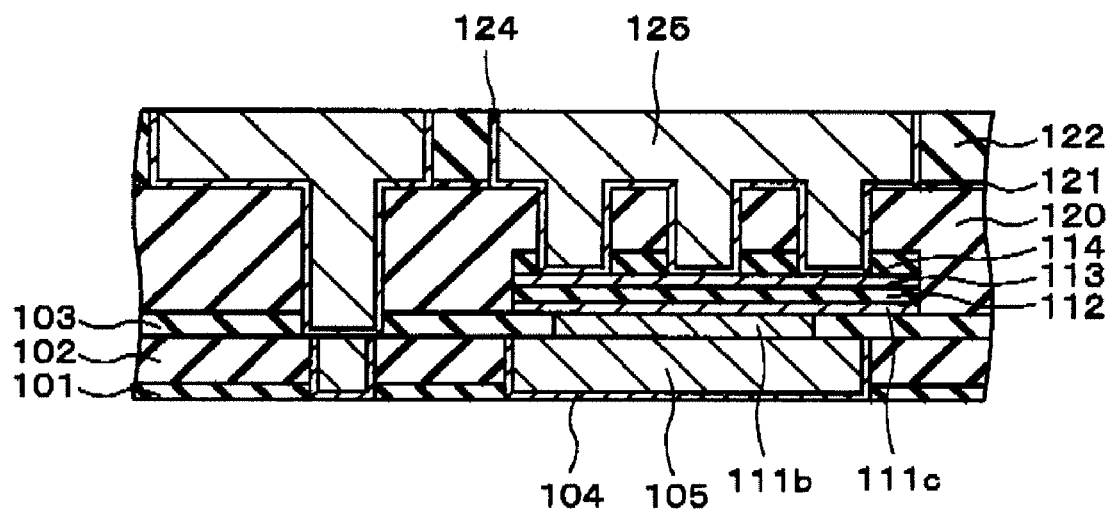
FIG. 18 is a cross-sectional diagram showing the structure of the fifth example of the present invention.

FIG. 18 shows a capacitor structure in which an MIM capacitance structure is formed on an embedded lower electrode in a fifth example. In the capacitor structure of the present invention, the lower electrode is formed in an embedded configuration. Therefore, the lower electrode surface is exposed in any position on a flat surface after the embedded electrode has been formed, as shown in FIG. 2F, and other portions are covered by the cap insulation film on the copper wiring. In the fifth example, after the embedded lower electrode has been formed, a second lower electrode film 111c, a capacitor insulation film 112, an upper electrode 113, and a capacitor cap film 114 are sequentially formed and patterned in a shape that encloses the embedded lower electrode. It is important at this point to reduce short circuiting in capacitor side walls that results from the byproducts formed when the second lower electrode is etched. A first method for reducing short-circuiting in the capacitor side walls is to taper the capacitor side walls. When the capacitor side walls are tapered, byproducts deposited on the side walls are also etched because the side walls are exposed to plasma particles that move in a very straight fashion. As a result, the byproducts are not left behind. A second method for reducing short circuiting in the capacitor side walls is to configure for the second lower electrode from a material composed solely of elements that form volatile etching byproducts.

Figure 23:
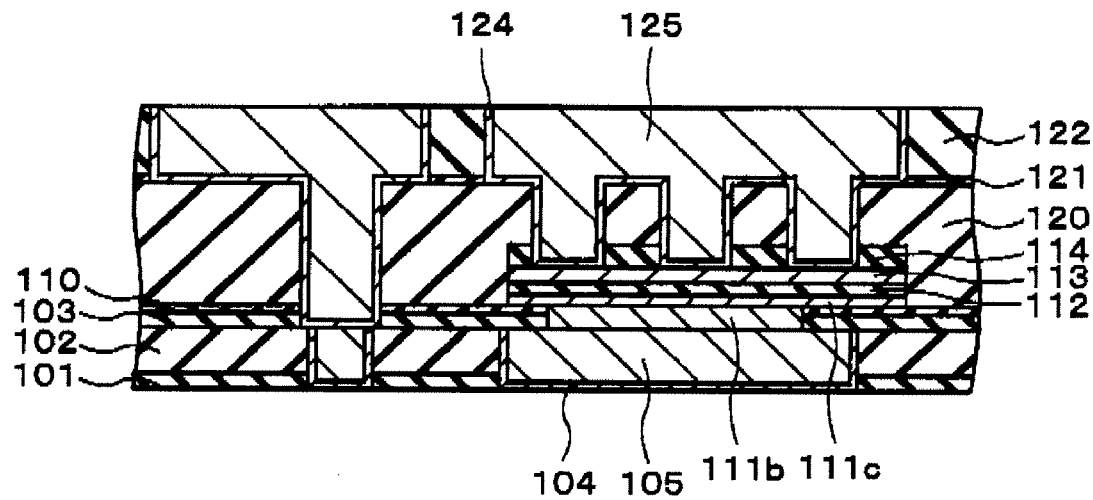
FIG. 23 is a cross-sectional diagram showing the structure of the fifth example of the present invention.
Figure 24:
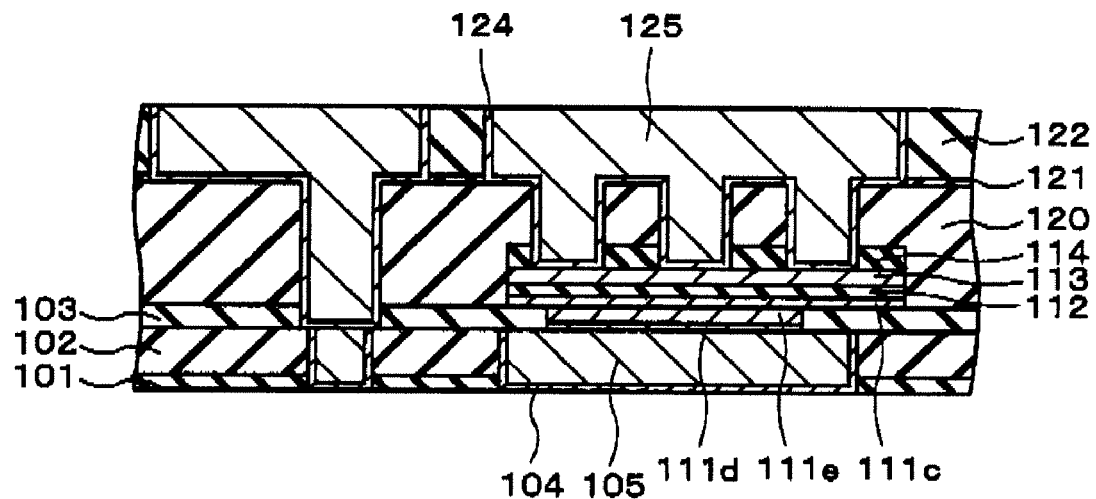
FIG. 24 is a cross-sectional diagram showing the structure of the fourth example of the present invention.
Figure 25:
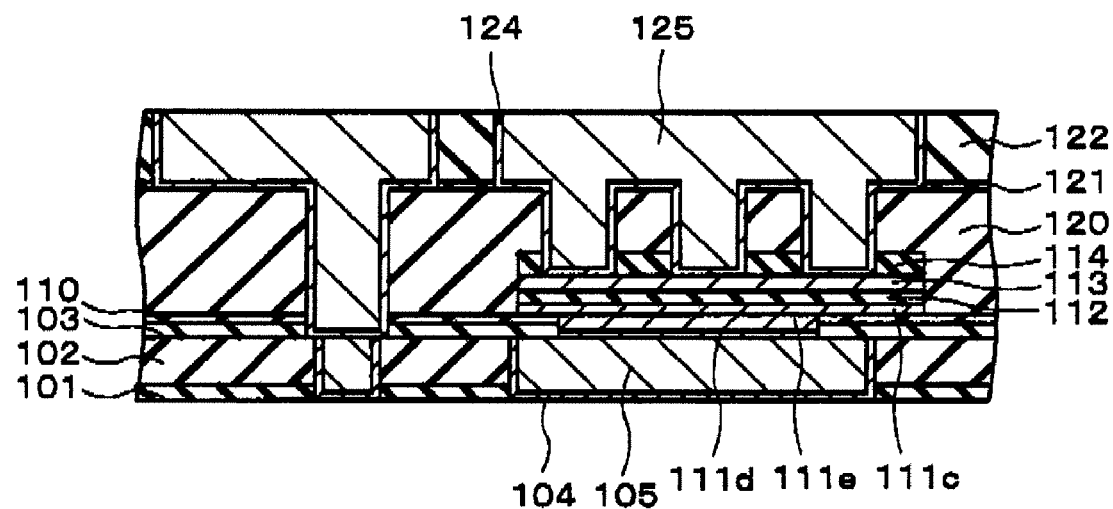
FIG. 25 is a cross-sectional diagram showing the structure of the fifth example of the present invention.

FIG. 23 explicitly shows in the present example that the portion in which embedded lower electrode has been embedded has a bilayer structure composed of a wiring cap film and a hard mask for processing the wiring cap. The hard mask and via-interlayer films are composed of the same material, and the hard mask thereby substantially conforms to the via-interlayer films to form the structure shown in FIG. 18. FIG. 24 shows in the present example that the embedded lower electrode has a multilayered structure composed of electroconductive materials having barrier properties, e.g., a metal nitride 111d and a low-resistance metallic film 111e. FIG. 25 is a structure in which the hard mask has been left behind in the CMP step during the formation of the embedded lower electrode, and is an example of adopting layered embedded electrodes. The metal nitride used as the electroconductive barrier film has a high resistance and degrades the performance of the capacitor element. It is therefore effective to minimize the thickness of the barrier film and to use a low-resistance metallic film as a remaining embedded portion. Specifically, the metal nitride 111d is TaN, the metallic film 111e is Ta, and the thickness is, e.g., 20 nm and 10 nm for Ta and TaN, respectively. The number of layers is not limited to two, and any number of layers may be used, e.g., TaN/Ta/TaN/Ta/TaN, and so forth.

A feature of this structure is that the surface on which a capacitor insulation film is formed is a uniformly flat electrode film formed across the entire surface of the wafer. The structure is effective in cases in which the characteristics of capacitor insulation film formation are different for the electrode film and the insulation film, and in cases in which a homogenous insulation film is formed at the boundary between the electrode film and the insulation film.

Industrial Applicability

The present invention provides a semiconductor device in which a capacitor element having a metallic layer/high dielectric insulating film/metallic layer structure is incorporated. The diffusion and thermal oxidation of the lower-layer wiring material are reduced, and the device can therefore be used as a semiconductor device in which a large-capacity capacitor element is mounted.

The invention claimed is:

1. A semiconductor device wherein a capacitor element in which an upper electrode, a capacitor insulation film, and a lower electrode are layered in order from the top is mounted on wiring, the semiconductor device, characterized in that
the lower electrode is embedded in a groove of a bilayer-structured insulation film composed of a wiring cap film and a hard mask used for processing the wiring cap film opened to a lower-layer wiring, wherein the bilayer-structured insulation film is formed on the underlying lower-layer wiring; and
the lower electrode and the lower-layer wiring are in direct contact, and the upper electrode is in contact with an overlying upper-layer wiring by way of a contact plug, and
comprising a multilayer wiring composed of three or more layers, the semiconductor device characterized in having a capacitor element layer on which the capacitor element is mounted between any two of the wiring layers, wherein at least two or more capacitor elements are layered; and the capacitor elements of each layer are connected in parallel by way of a wiring layer.

2. The semiconductor device according to claim 1, characterized in that the upper electrode and the capacitor insulation film are formed over a region that extends beyond the edge of the lower electrode, in a planar view.

3. The semiconductor device according to claim 1, further characterized in that copper is the principal component of all the elements selected from the lower-layer wiring directly connected to the lower electrode of the capacitor element, an upper-layer wiring on the upper layer of the capacitance element, the via-plug for connecting the lower-layer wiring and the upper-layer wiring, and the contact plug for connecting the upper electrode and the upper-layer wiring.

4. The semiconductor device according to claim 3, further characterized in that the insulation film arranged on at least the lower layer of the bilayer-structured insulation film, which is formed on the lower-layer wiring and in which the lower electrode is embedded, is formed from a material that reduces copper diffusion.

5. The semiconductor device according to claim 3, further characterized in that the insulation film arranged on at least the lower layer of the bilayer-structured insulation film, which is formed on the lower-layer wiring and in which the lower electrode is embedded, is composed of SiN or SiCN.

6. The semiconductor device according to claim 1, further characterized in that the lower electrode embedded in the bilayer-structured insulation film is a TaN film.

7. A semiconductor device wherein a capacitor element in which an upper electrode, a capacitor insulation film, and a lower electrode are layered in order from the top is mounted on wiring, the semiconductor device, characterized in that
the lower electrode is embedded in a groove of a bilayer-structured insulation film composed of a wiring cap film and a hard mask used for processing the wiring cap film opened to a lower-layer wiring wherein the bilayer-structured insulation film is formed on the underlying lower-layer wiring; and
the lower electrode and the lower-layer wiring are in direct contact, and the upper electrode is in contact with an overlying upper-layer wiring by way of a contact plug,
wherein the lower electrode embedded in the bilayer-structured insulation film is a TaN film, wherein at least two or more capacitor elements are layered, and wherein a same aperture is used to completely form a via-plug for connecting the upper layer wiring and the lower-layer wiring and the contact plug, which are formed for that part of a wiring in which the upper electrodes of the capacitor elements are connected in parallel.

8. A semiconductor device with a capacitor element, comprising:

an interlayer insulation film having a groove formed therein;

an embedded lower-layer wiring composed of a barrier metal and groove-filling copper formed in the groove;

a bilayer-structured film composed of a wiring cap film and a hard mask formed on a lower-level wiring for preventing diffusion and oxidation of the lower-level wiring;

a lower electrode embedded in the bilayer-structured film and formed so as to be in direct contact with the lower-layer wiring in a groove opened to the embedded lower-level wiring in a prescribed area of the wiring cap film, the lower electrode being formed of a material that has the ability to prevent diffusion of the wiring material due to direct contact between the lower electrode and the lower-layer wiring and providing a flat surface;

a capacitor insulation film is formed on the flat surface of the lower electrode and an upper electrode formed on the capacitor insulation film, the upper electrode and capacitor insulation film being shaped, in terms of arrangement, so as to enclose the lower electrode such that the upper electrode and capacitor insulation film are formed to an area that is beyond the edge of the lower electrode, in a planar view;

a capacitor cap film formed on an upper portion of the capacitor element; and a via-interlayer insulation film formed over the capacitor cap film.

* * * * *

UNITED STATES PATENT AND TRADEMARK OFFICE
CERTIFICATE OF CORRECTION

PATENT NO. : 8,227,893 B2  Page 1 of 1
APPLICATION NO. : 11/571084
DATED : July 24, 2012
INVENTOR(S) : Inoue et al.

It is certified that error appears in the above-identified patent and that said Letters Patent is hereby corrected as shown below:

Title page: Item (86), please correct the international application number to read
-- PCT/JP2005/011561 --

Signed and Sealed this
Fourth Day of September, 2012

David J. Kappos
*Director of the United States Patent and Trademark Office*